United States Patent
Murakoshi et al.

(10) Patent No.: US 10,818,688 B2
(45) Date of Patent: Oct. 27, 2020

(54) STORAGE DEVICE

(71) Applicant: TOSHIBA MEMORY CORPORATION, Minato-ku, Tokyo (JP)

(72) Inventors: Atsushi Murakoshi, Yokkaichi Mie (JP); Hiroki Sasaki, Nagoya Aichi (JP)

(73) Assignee: TOSHIBA MEMORY CORPORATION, Tokyo (JP)

( * ) Notice: Subject to any disclaimer, the term of this patent is extended or adjusted under 35 U.S.C. 154(b) by 0 days.

(21) Appl. No.: 16/124,112

(22) Filed: Sep. 6, 2018

(65) Prior Publication Data
US 2019/0259774 A1  Aug. 22, 2019

(30) Foreign Application Priority Data

Feb. 20, 2018  (JP) ................... 2018-027594

(51) Int. Cl.
| | |
|---|---|
| *H01L 27/11582* | (2017.01) |
| *H01L 29/51* | (2006.01) |
| *H01L 29/66* | (2006.01) |
| *H01L 27/11556* | (2017.01) |
| *H01L 27/11578* | (2017.01) |
| *H01L 27/11514* | (2017.01) |

(52) U.S. Cl.
CPC .. *H01L 27/11582* (2013.01); *H01L 27/11514* (2013.01); *H01L 27/11556* (2013.01); *H01L 27/11578* (2013.01); *H01L 29/517* (2013.01); *H01L 29/66825* (2013.01); *H01L 29/66833* (2013.01); *H01L 2924/1438* (2013.01)

(58) Field of Classification Search
CPC ......... H01L 27/11582; H01L 27/11556; H01L 29/517; H01L 29/66825; H01L 29/66833; H01L 27/11551; H01L 27/11578; H01L 27/11514; H01L 2924/1438
See application file for complete search history.

(56) References Cited

U.S. PATENT DOCUMENTS

| | | | |
|---|---|---|---|
| 9,202,819 B2 | 12/2015 | Lee et al. | |
| 9,666,381 B2 | 5/2017 | Chevalier et al. | |
| 9,666,593 B2 | 5/2017 | Pang et al. | |
| 9,847,342 B2 | 12/2017 | Nagashima et al. | |
| 9,899,410 B1* | 2/2018 | Cho | H01L 29/42332 |
| 10,038,008 B1* | 7/2018 | Hopkins | H01L 27/11582 |
| 2006/0205124 A1* | 9/2006 | Herner | H01L 21/84 |
| | | | 438/149 |

(Continued)

*Primary Examiner* — Feifei Yeung Lopez
(74) *Attorney, Agent, or Firm* — Foley & Lardner LLP

(57) ABSTRACT

A storage device includes: a plurality of electrode films stacked in a first direction, and extending in a second direction intersecting the first direction; a first semiconductor film provided adjacent to the plurality of electrode films, and extending in the first direction; a first charge holding film provided between one electrode film among the plurality of electrode films, and the semiconductor film, and including any one of a metal, a metal compound, and a high dielectric material; and a second semiconductor film located between the first semiconductor film and the charge holding film, and extending in the first direction along the first semiconductor film. The second semiconductor film is electrically insulated from the plurality of electrode films, the first charge holding film, and the first semiconductor film.

15 Claims, 23 Drawing Sheets

(56) References Cited

U.S. PATENT DOCUMENTS

| | | | |
|---|---|---|---|
| 2011/0298038 A1* | 12/2011 | Son | H01L 27/11578 257/324 |
| 2015/0294980 A1* | 10/2015 | Lee | H01L 27/11582 257/324 |
| 2016/0071861 A1* | 3/2016 | Serov | H01L 27/11556 365/185.19 |
| 2017/0263613 A1 | 9/2017 | Murakoshi et al. | |

* cited by examiner

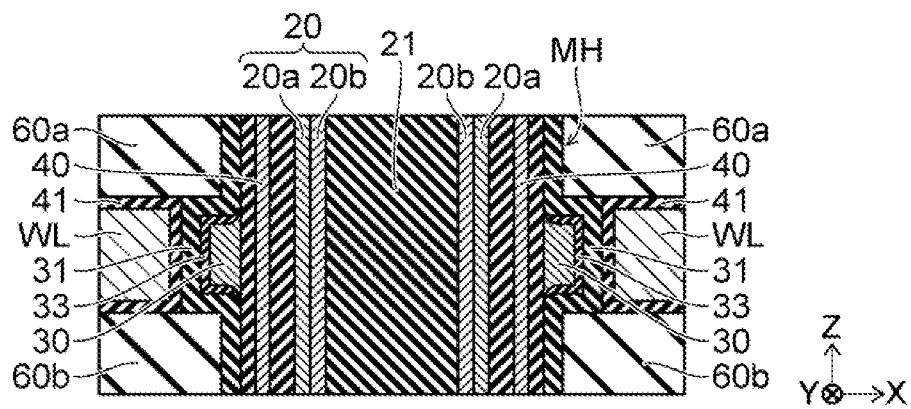
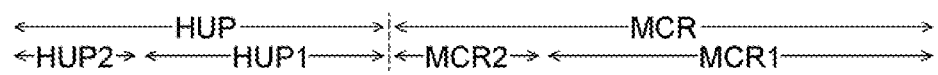
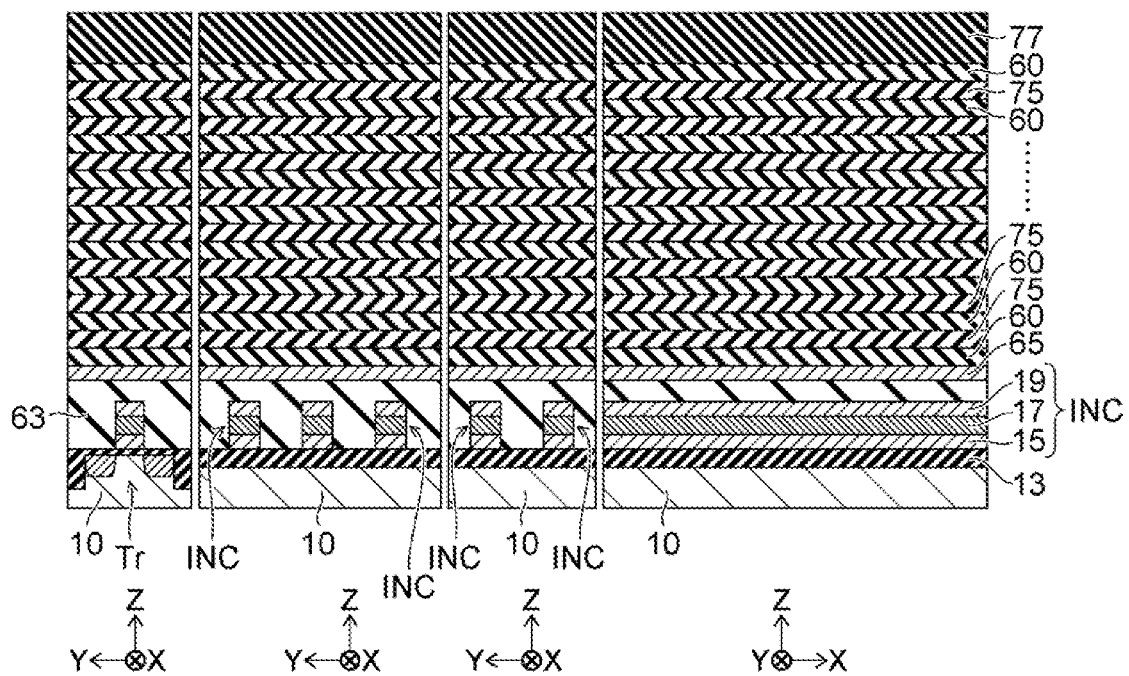

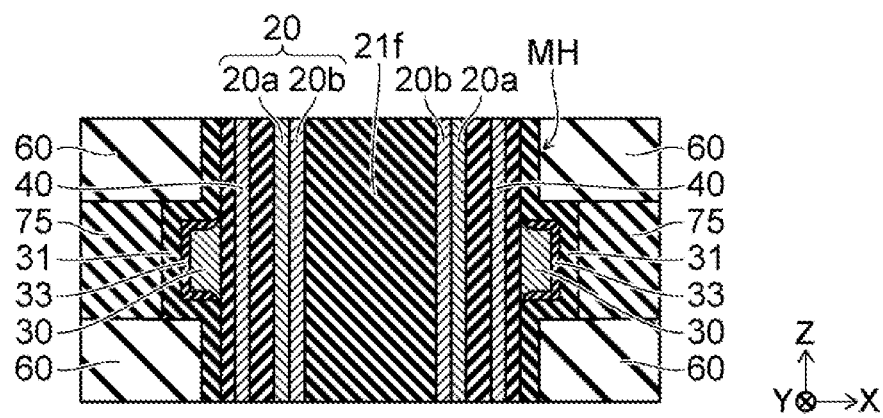
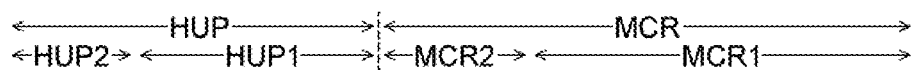
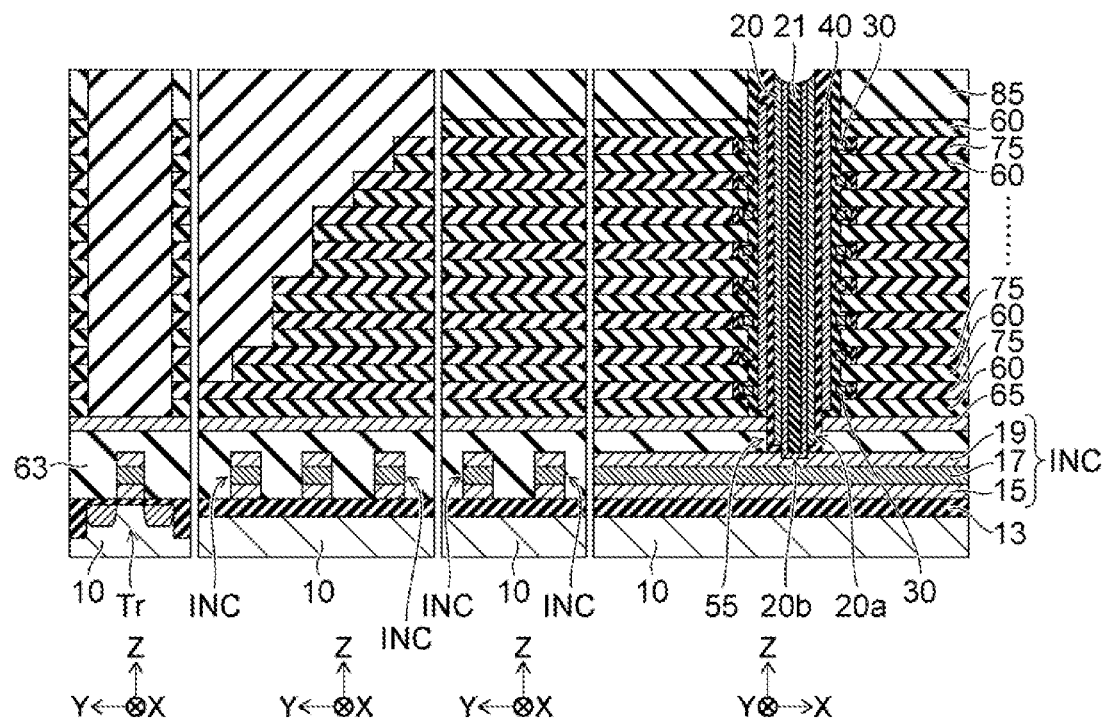

US 10,818,688 B2

STORAGE DEVICE

CROSS-REFERENCE TO RELATED APPLICATION

This application is based on and claims the benefit of Japanese Patent Application No. 2018-027594, filed, Feb. 20, 2018, the entire contents of which are incorporated herein by reference.

FIELD

Embodiments described herein relate generally to a storage device.

BACKGROUND

A storage device is being developed in which memory cells are three-dimensionally arranged so as to increase a storage capacity. For example, a NAND-type storage device has a memory cell structure in which a plurality of electrode films are stacked and a charge holding portion is interposed between a semiconductor film extending in the stacking direction and each of the electrode films. The charge holding portion may include a floating gate that includes, for example, polysilicon, and a charge holding film containing a metal or a high dielectric constant material in order to improve a memory retention property. However, a memory cell having a structure including both the floating gate and the charge holding film between the electrode films and the semiconductor film might be limited in a size reduction thereof, which becomes a factor that hinders miniaturization.

DESCRIPTION OF THE DRAWINGS

FIGS. 2A and 2B are schematic views illustrating a memory cell of the storage device according to the embodiment.

FIG. 3 is a schematic view illustrating a manufacturing process of the storage device according to the embodiment.

FIGS. 18A to 18C are schematic views illustrating the manufacturing process according to the embodiment.

FIG. 19 is a schematic view illustrating the manufacturing process according to the embodiment.

DETAILED DESCRIPTION

Figure 1:
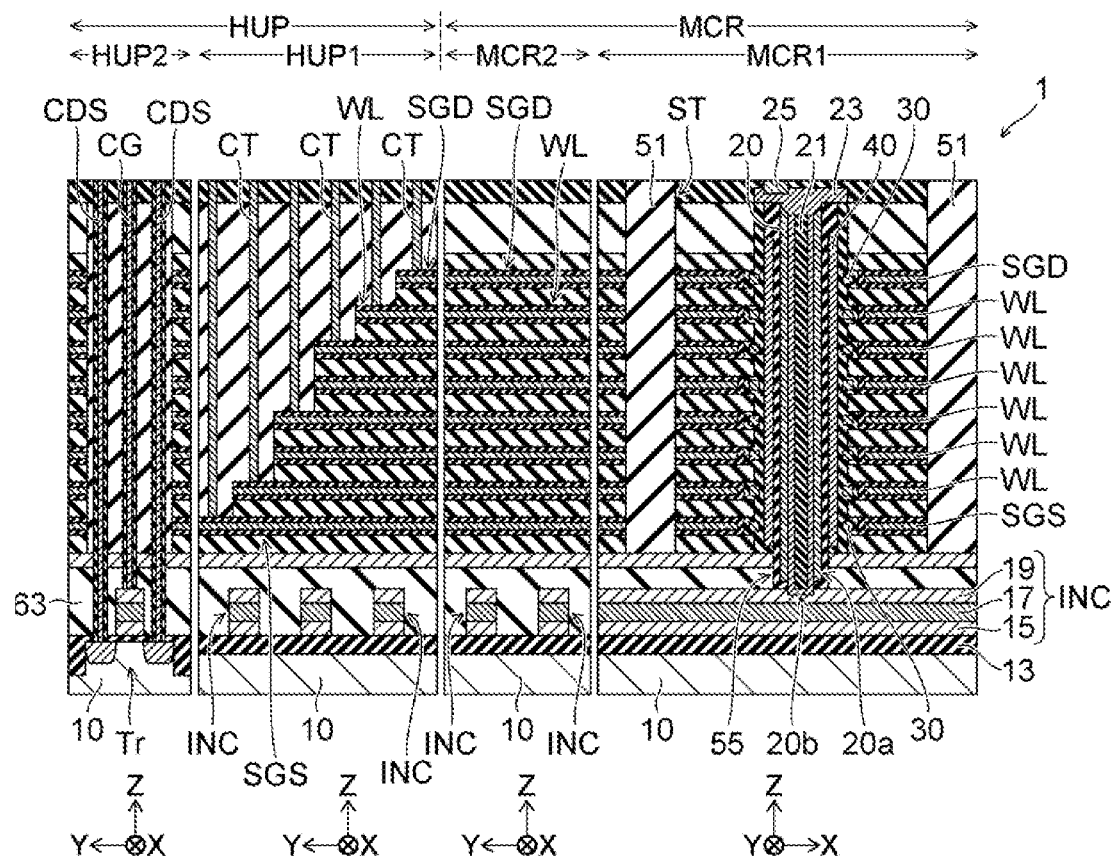
FIG. 1 is a schematic sectional view illustrating a storage device according to an embodiment.

An embodiment provides a storage device with an improved memory retention property of a memory cell, which may be miniaturized.

In general, according to one embodiment, a storage device includes: a plurality of first electrode films stacked in a first direction, and extending in a second direction intersecting the first direction; a first semiconductor film provided adjacent to the plurality of first electrode films, and extending in the first direction; a first charge holding film provided between one first electrode film among the plurality of first electrode films, and the first semiconductor film, and including any one of a metal, a metal compound, and a high dielectric material; and a second semiconductor film located between the first semiconductor film and the first charge holding film, and extending in the first direction along the first semiconductor film. The second semiconductor film is electrically insulated from the plurality of first electrode films, the first charge holding film, and the first semiconductor film.

Hereinafter, the embodiment will be described with reference to drawings. Same or similar portions (e.g. devices, components, structures, or portions thereof) shown in the drawings are denoted by the same reference labels or numbers, and detailed descriptions thereof may be omitted, and differences may be pointed out. It is noted that the drawings are schematic or conceptual, and the depicted relationship between a thickness and a width of each portion, a ratio of sizes between portions, and the like are not necessarily the same as actual ones and may be exaggerated or altered for explanatory purposes. Even when the same portions are illustrated, dimensions or ratios may be different from each other.

The arrangement and configuration of each portion will be described using an X axis, a Y axis, and a Z axis illustrated in each drawing. The X axis, the Y axis, and the Z axis are perpendicular to each other, and indicate an X direction, a Y direction, and a Z direction, respectively. The Z direction may be described as upward, and the opposite direction may be described as downward.

FIG. 1 is a schematic sectional view illustrating a storage device 1 according to the embodiment. The storage device 1 is a NAND-type storage device including three-dimensionally arranged memory cells, and includes a memory cell region MCR, and a lead-out region HUP.

The memory cell region MCR includes a plurality of electrode films (hereinafter, word lines WL, and select gates SGS and SGD) stacked in the Z direction. The lead-out region HUP includes the word lines WL, the select gates SGS and SGD, and contact plugs CT, CG, and CDS which electrically connect electronic circuits at lower layers to an upper layer wiring (not illustrated).

FIG. 1 illustrates sectional views MCR1 and MCR2 of the memory cell region MCR, and sectional views HUP1 and HUP2 of the lead-out region. The sectional view MCR1 illustrates a section of the memory cell region MCR along the X-Z plane, and the sectional view MCR2 illustrates a section of the memory cell region MCR along the Y-Z plane. The sectional view HUP1 illustrates a section of the lead-out region HUP along the Y-Z plane, and the sectional view HUP2 illustrates a section of the lead-out region HUP along the Y-Z plane.

As illustrated in FIG. 1, the storage device 1 includes the select gate SGS, the word lines WL, the select gate SGD, and a semiconductor film 20. Each of the select gate SGS, the word lines WL, and the select gate SGD extends in the Y direction. The semiconductor film 20 extends in the stacking direction (the Z direction) of the select gate SGS, the word lines WL, and the select gate SGD. Charge holding films 30 are provided between the semiconductor film 20 and each of the select gate SGS, the word lines WL, and the select gate SGD. The charge holding films 30 are arranged along the semiconductor film 20 in the Z direction, and are provided to be spaced from each other in the Z direction.

The storage device 1 further includes a floating potential film 40 between the semiconductor film 20 and the charge holding films 30. The floating potential film 40 is electrically insulated from the select gate SGS, the word lines WL, the select gate SGD, and the semiconductor film 20. The floating potential film 40 is provided along the semiconductor film 20 to extend in the Z direction. The floating potential film 40 is, for example, a semiconductor film continuously extending in the Z direction. The floating potential film 40 is, for example, a P-type semiconductor film doped with a P-type impurity.

The semiconductor film 20 has a structure in which a semiconductor film 20a and a semiconductor film 20b are stacked in the X direction. The semiconductor film 20 is, for example, provided to cover an insulating core 21. The insulating core 21 is, for example, columnar silicon oxide extending in the Z direction. The semiconductor film 20b is located between the semiconductor film 20a and the insulating core 21. The semiconductor film 20 is electrically connected to an upper layer bit line (not illustrated) through a cap film 23 and a connection plug 25. The bit line is provided to extend, for example, in the X direction.

The lower end of the semiconductor film 20 is connected to a wiring INC in the lower layer. The wiring INC is provided on, for example, a substrate 10 through an interlayer insulating film 13. The wiring INC extends in, for example, the X direction to connect to a plurality of semiconductor films 20 (not illustrated). The wiring INC has a structure in which, for example, a semiconductor film 15, a metal film 17, and a semiconductor film 19 are sequentially stacked in the Z direction. The semiconductor film 20 is connected to the semiconductor film 19.

As illustrated in the lead-out region HUP1 in FIG. 1, end portions of the select gate SGS, the word lines WL, and the select gate SGD are provided in a stepped shape. The length of the select gate SGS in the Y direction is longer than the length of the select gate SGD in the Y direction. The Y direction length of the word line WL located close to, or adjacent to, the select gate SGS is longer than the Y direction length of the word line WL close to, or adjacent to, the select gate SGD.

The contact plugs CT extend in the Z direction to connect to respective end portions. The Z direction length of the contact plug CT electrically connected to the select gate SGS is longer than the Z direction length of the contact plug CT electrically connected to the select gate SGD. The Z direction length of the contact plug CT electrically connected to the word line WL located close to, or adjacent to, the select gate SGS is longer than the Z direction length of the contact plug CT electrically connected to the word line WL close to, or adjacent to, the select gate SGD.

The lead-out region HUP2 also includes the contact plugs CDS and CG. The lead-out region HUP2 is provided outside the memory cell region MCR and the lead-out region HUP1. The contact plugs CDS are connected to a source region and a drain region of a transistor Tr provided in the substrate 10, respectively, and the contact plug CG is connected to a gate electrode of the transistor Tr. The gate electrode of the transistor Tr has, for example, the same stacked structure as that of the wiring INC provided in the memory cell region MCR.

Figure 2A:
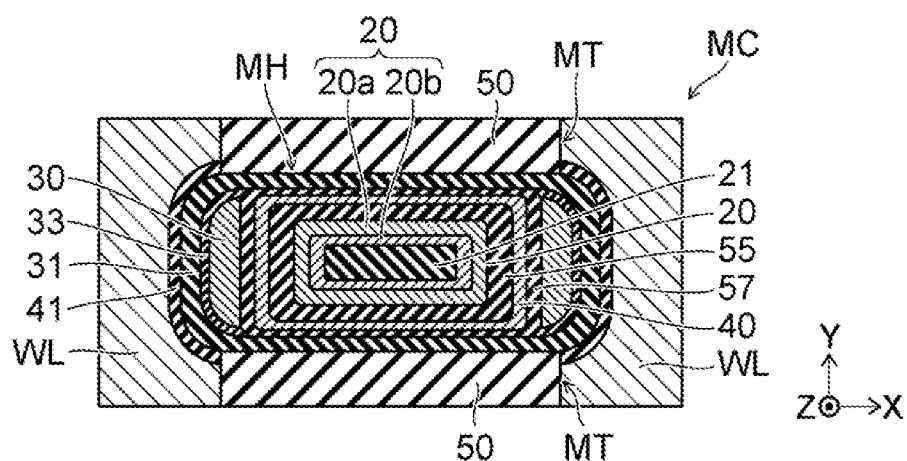

FIGS. 2A and 2B are schematic views illustrating the structure of a memory cell MC of the storage device according to the embodiment. FIG. 2A is a sectional view along an X-Y plane including the semiconductor film 20, and FIG. 2B is a sectional view along an X-Z plane.

As illustrated in FIG. 2A, the semiconductor film 20 is disposed within a memory hole MH provided between the word lines WL adjacent to each other in the X direction. The memory hole MH extends in the Z direction to divide an insulating film 50 disposed in a groove MT between the adjacent word lines WL. The semiconductor film 20 includes the semiconductor films 20a and 20b, and surrounds the insulating core 21.

The floating potential film 40 is provided within the memory hole MH. The floating potential film 40 is provided to surround the semiconductor film 20. An insulating film 55 is provided between the semiconductor film 20 and the floating potential film 40. The insulating film 55 functions as, for example, a tunnel insulating film.

The charge holding films 30 are provided between the word lines WL and the floating potential film 40. Each of the charge holding films 30 is provided between the floating potential film 40 and one of the word lines WL adjacent to each other in the X direction, and between the floating potential film 40 and the other word line WL. Between the word line WL and the charge holding film 30, an insulating film 31, an insulating film 33, and an insulating film 41 are provided.

The insulating film 31 is, for example, a silicon oxide film. The insulating film 33 is provided between the charge holding film 30 and the insulating film 31. The insulating film 33 is, for example, a silicon nitride film. The insulating film 41 is provided between the word line WL and the insulating film 31. The insulating film 41 is, for example, an aluminum oxide film. The insulating film 31, the insulating film 33, and the insulating film 41 function as a block insulating film having a stacked structure.

An insulating film 57 is provided between the charge holding film 30 and the floating potential film 40. The insulating film 57 is, for example, a silicon oxynitride film. The insulating film 57 is provided with a thickness smaller than, for example, the tunnel insulating film and the block insulating film.

As illustrated in FIG. 2B, the word line WL is located between an interlayer insulating film 60a and an interlayer insulating film 60b. The insulating film 41 also includes a portion located between the word line WL and the interlayer insulating film 60a, and a portion located between the word line WL and the interlayer insulating film 60b.

At least a part of the charge holding film 30 is provided to be located between the interlayer insulating film 60a and the interlayer insulating film 60b. The floating potential film 40 is located between the semiconductor film 20 and the charge holding films 30, and extends along the semiconductor film 20 in the Z direction. The thickness of the floating potential film 40 in the X direction, between an interface with the insulating film 57 and an interface with the insulating film 55, ranges from about 2.2 nanometers (nm) to 6 nm.

In the present embodiment, memory cells MC arranged in the Z direction along the semiconductor film 20 share one floating potential film 40. That is, the memory cell MC includes one word line WL as a control gate, and includes the semiconductor film 20 as a channel film. The memory cell MC includes one charge holding film 30 located between one word line WL and the semiconductor film 20, and a part of the floating potential film 40 located between one word line WL and the semiconductor film 20. In the memory cells MC according to the present embodiment, the floating potential film 40 as a thin film is shared so that a distance between the word line WL and the semiconductor film 20 is reduced. The floating potential film 40 may, in some implementations, not be disposed between the interlayer insulating film 60a and the interlayer insulating film 60b. The floating potential film 40 may be disposed adjacent to the interlayer insulating film 60a and the interlayer insulating film 60b. Thus, it is possible to reduce the size in the X direction.

For example, by way of comparison, when the floating potential films 40 of a plurality of memory cells are disposed to be spaced from each other in the Z direction in the same manner as the charge holding films 30, both the charge holding film 30 and the floating potential film 40 are formed to be located between the interlayer insulating film 60a and the interlayer insulating film 60b. In such a configuration, a distance between the word line WL and the semiconductor film 20 becomes wider than that in the example illustrated in FIG. 2B, and thus the size of the memory cell MC in the X direction increases. That is, in the storage device 1 according to the present embodiment, the size of the memory cell MC may be reduced, and a storage capacity may be increased.

Next, a method of manufacturing the storage device 1 will be described with reference to FIGS. 3 to 24. FIGS. 3 to 24 are schematic views illustrating a manufacturing process of the storage device 1 according to the embodiment.

FIG. 3 is a schematic view illustrating a section of a wafer in the manufacturing process of the storage device 1. For example, the substrate 10 is a silicon wafer, and a peripheral circuit including a transistor Tr, and the wiring INC are formed on the upper surface of the substrate 10.

As illustrated in FIG. 3, an interlayer insulating film 63 is formed to cover the transistor Tr and the wiring INC, and, for example, a polysilicon film 65 is formed on the interlayer insulating film 63. The interlayer insulating film 63 is, for example, a silicon oxide film.

Subsequently, an interlayer insulating film 60 and a sacrifice film 75 are alternately stacked on the polysilicon film 65. The number of stacks of the sacrifice films 75 is the same as the number of stacks of, for example, electrode films including the word lines WL and the select gates SGS and SGD. An insulating film 77 is formed on the uppermost interlayer insulating film 60. The interlayer insulating film 60 is, for example, a silicon oxide film. The sacrifice film 75 and the insulating film 77 are, for example, silicon nitride films.

Figure 4:
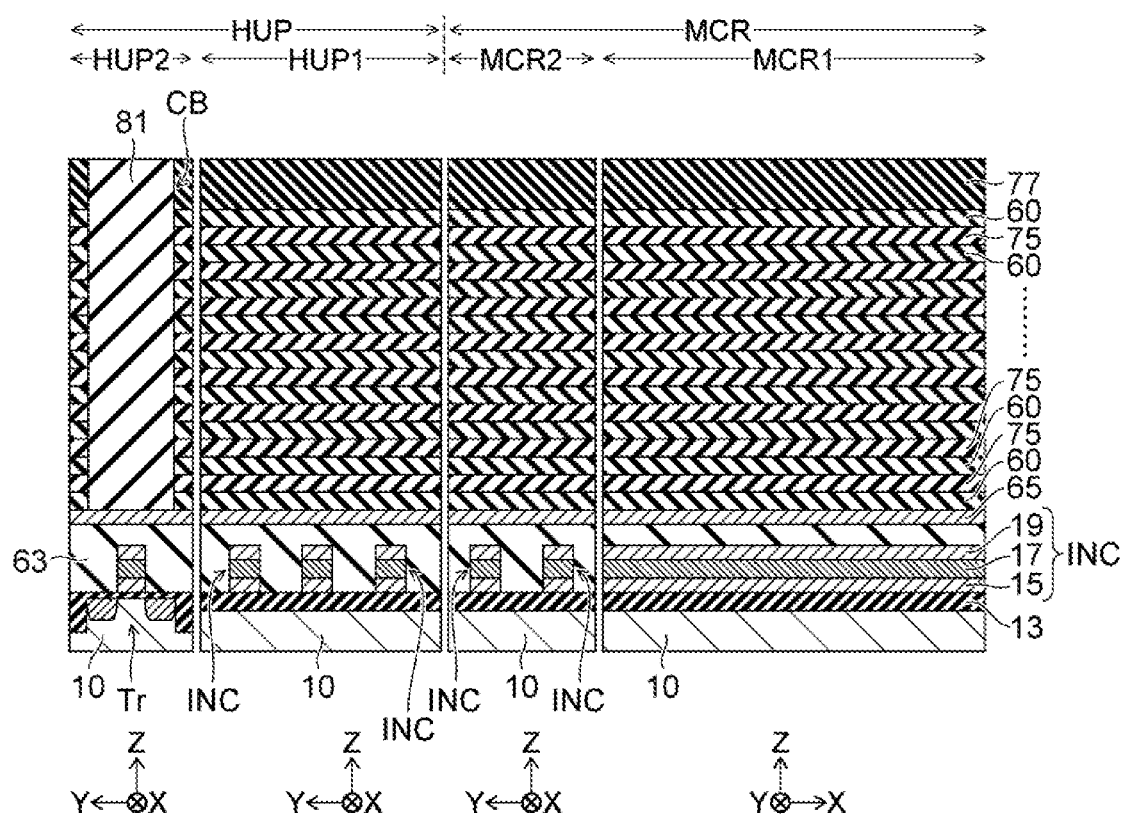
FIG. 4 is a schematic view illustrating the manufacturing process according to the embodiment.

FIG. 4 is a schematic view illustrating the same section as that of FIG. 3. As illustrated in FIG. 4, in the lead-out region HUP, a groove CB is formed above the peripheral circuit including the transistor Tr, and an insulating material 81 is disposed within the groove CB.

The groove CB is formed by selectively removing the insulating film 77, the interlayer insulating films 60 and the sacrifice films 75. Here, the polysilicon film 65 functions as an etching stopper. That is, the groove CB is formed such that the polysilicon film 65 is exposed at the bottom surface of the groove CB.

Thereafter, the insulating material 81 is formed to substantially fill the groove CB. The insulating material 81 includes, for example, silicon oxide, and is formed using TEOS-chemical vapor deposition (CVD). The upper surface of the insulating material 81 is flattened to the same level as the upper surface of the insulating film 77 by using, for example, chemical mechanical polishing (CMP). The insulating film 77 is provided to function as a stopper film in the CMP.

Figure 5:
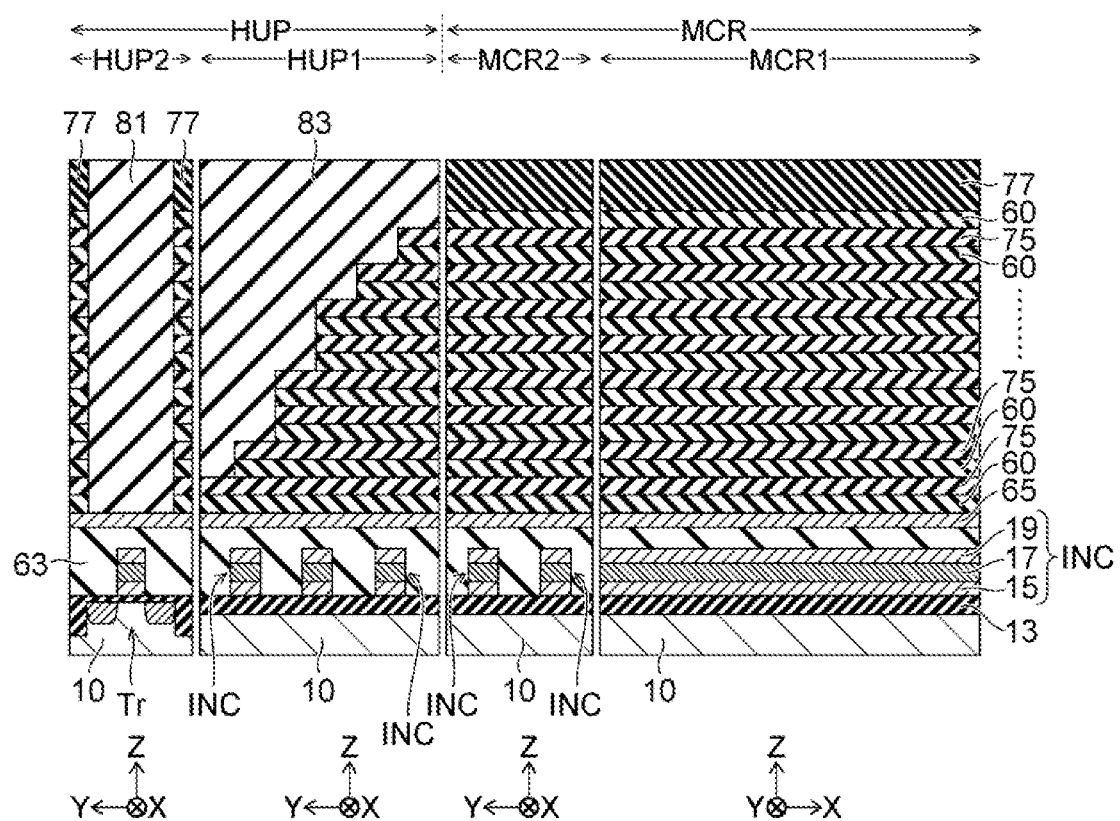
FIG. 5 is a schematic view illustrating the manufacturing process according to the embodiment.

FIG. 5 is a schematic view illustrating the same section as that of FIG. 4. As illustrated in FIG. 5, in the lead-out region HUP, end portions of the interlayer insulating films 60 and the sacrifice films 75 are formed in a stepped shape. An insulating material 83 is formed to cover the end portions of the interlayer insulating films 60 and the sacrifice films 75.

The end portions of the interlayer insulating films 60 and the sacrifice films 75 are sequentially etched from the upper layer using a selective mask having varying opening widths, and then are formed in the stepped shape. The insulating material 83 includes, for example, silicon oxide, and is formed using TEOS-CVD. The upper surface of the insulating material 83 is flattened to the same level as the upper surface of the insulating film 77 and the insulating material 81 using, for example, CMP.

Figure 6:
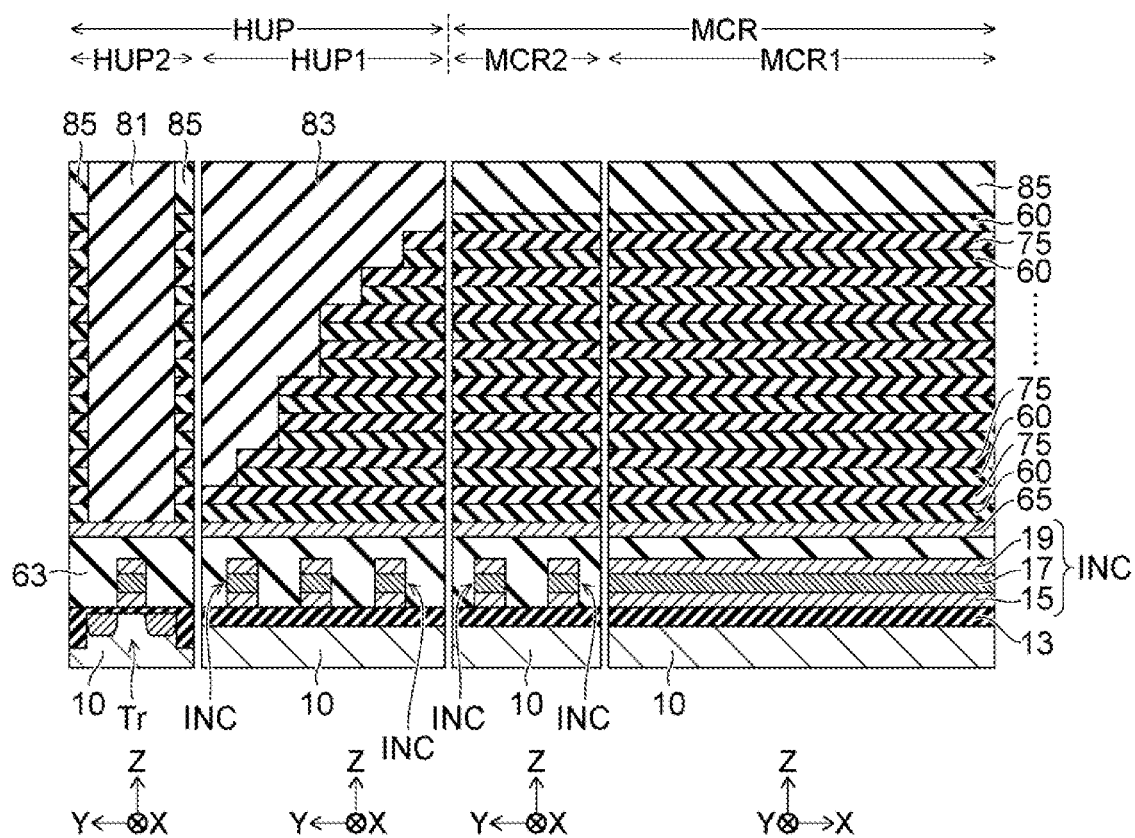
FIG. 6 is a schematic view illustrating the manufacturing process according to the embodiment.

FIG. 6 is a schematic view illustrating the same section as that of FIG. 5. As illustrated in FIG. 6, the insulating film 77 is replaced by an insulating film 85. That is, after the insulating film 77 is selectively removed, the insulating film 85 is formed. The insulating film 85 is, for example, a silicon oxide film, and is formed using TEOS-CVD.

Figure 7A:
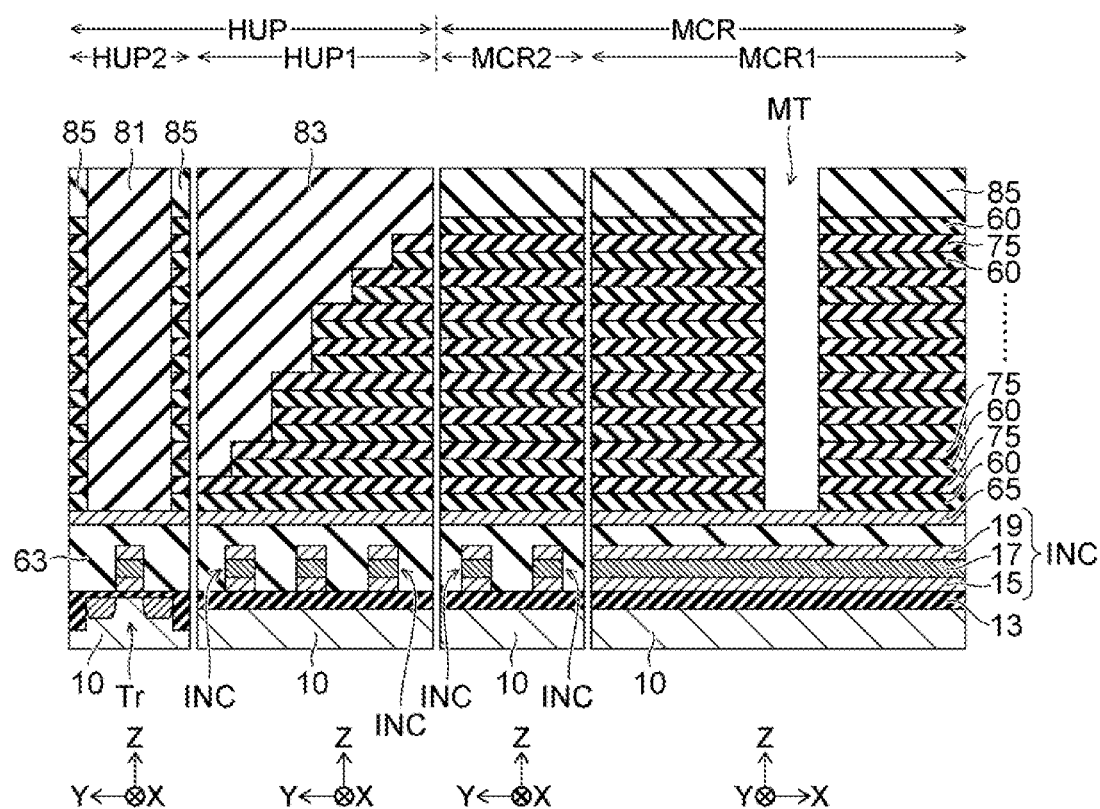
FIGS. 7A and 7B are schematic views illustrating the manufacturing process according to the embodiment.

FIG. 7A is a schematic view illustrating the same section as that of FIG. 6. As illustrated in FIG. 7A, in the memory cell region MCR, the groove MT is formed with a depth from the upper surface of the insulating film 85 to the polysilicon film 65. The groove MT is formed by selectively removing the insulating film 85, the interlayer insulating films 60 and the sacrifice films 75, using, for example, anisotropic reactive ion etching (RIE). In this case as well, the polysilicon film 65 functions as an etching stopper.

Figure 7B:
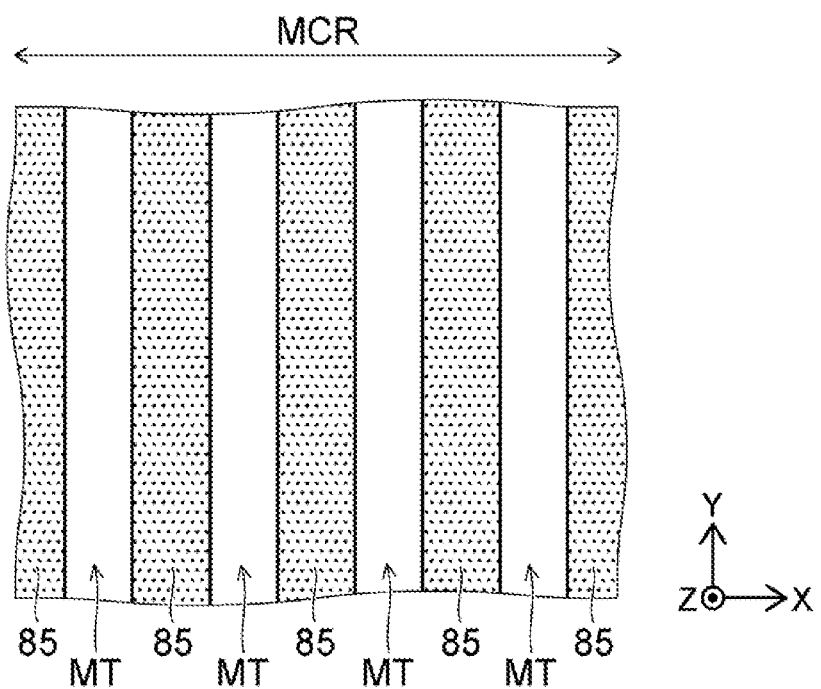

FIG. 7B is a schematic view illustrating the upper surface of the insulating film 85 in the memory cell region MCR. As illustrated in FIG. 7B, the groove MT is formed to extend in, for example, the Y direction. In the memory cell region MCR, the plurality of grooves MT are formed.

Figure 8:
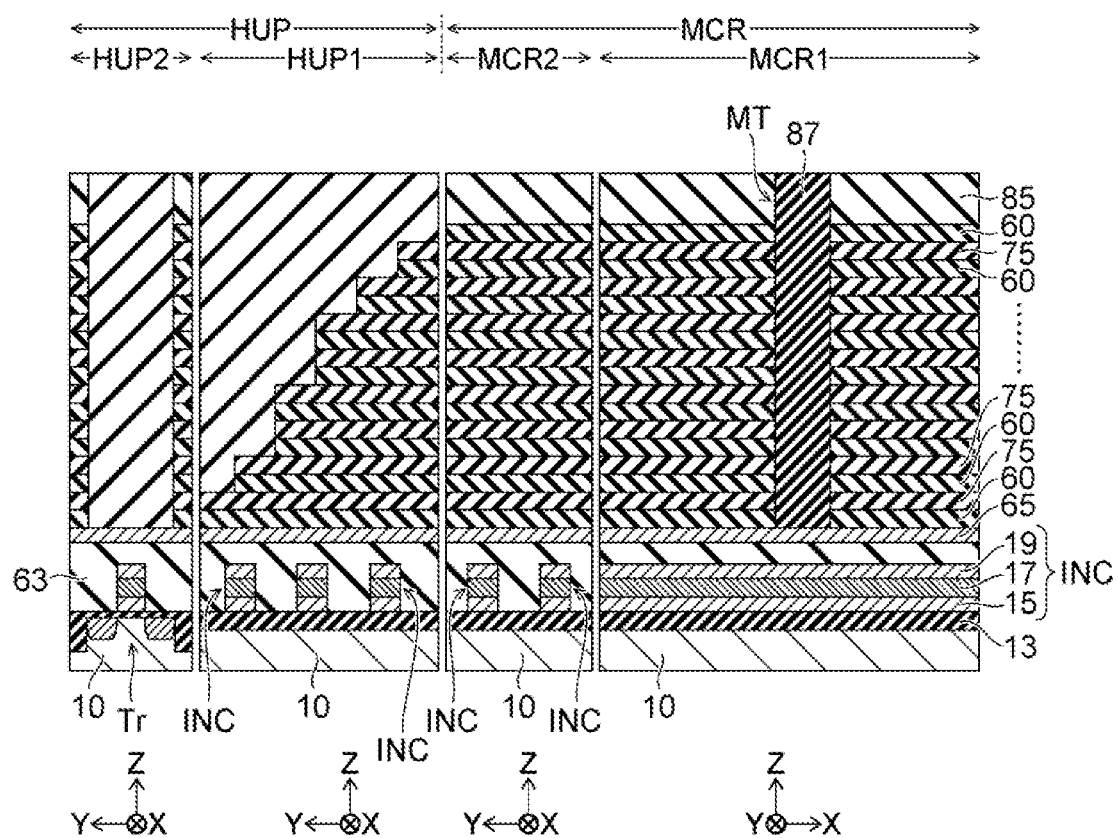
FIG. 8 is a schematic view illustrating the manufacturing process according to the embodiment.

FIG. 8 is a schematic view illustrating the same section as that of FIG. 7A. As illustrated in FIG. 8, an insulating material 87 is disposed within the groove MT. The insulating material 87 is formed using, for example, a spin coating method, and contains polysilazane (PSZ). The upper surface of the insulating material 87 is flattened to substantially the same level as the upper surface of the insulating film 85.

Figure 9:
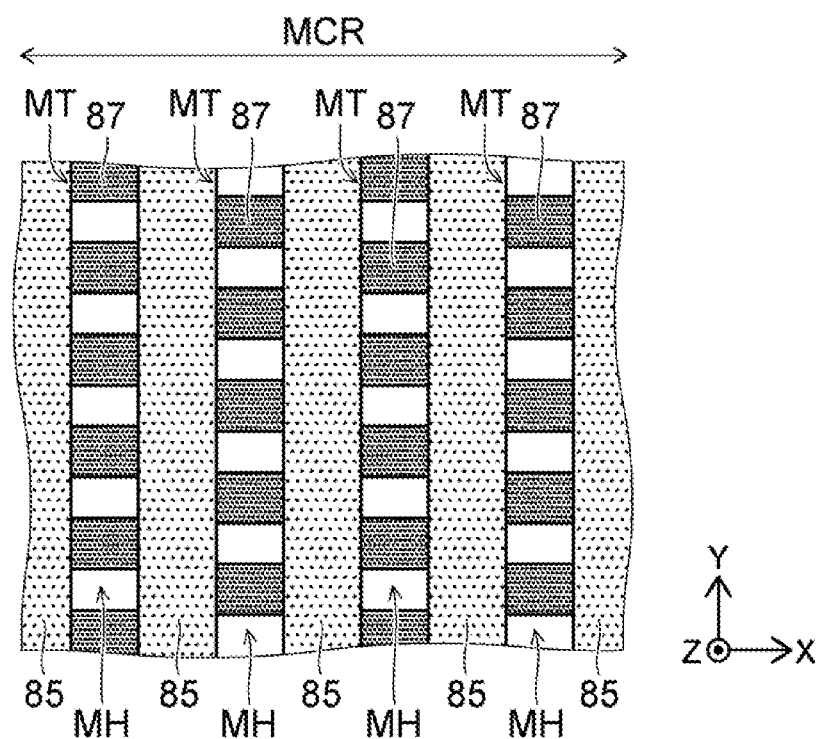
FIG. 9 is a schematic view illustrating the manufacturing process according to the embodiment.

FIG. 9 is a schematic view illustrating the upper surface of the insulating film 85 in the memory cell region MCR. As illustrated in FIG. 9, the memory holes MH are formed within the groove MT. The memory holes MH are formed to divide, for example, the insulating material 87. The memory holes MH are formed by selectively etching the insulating material 87, and have a depth from the upper surface of the insulating material 87 to the polysilicon film 65.

Figure 10A:
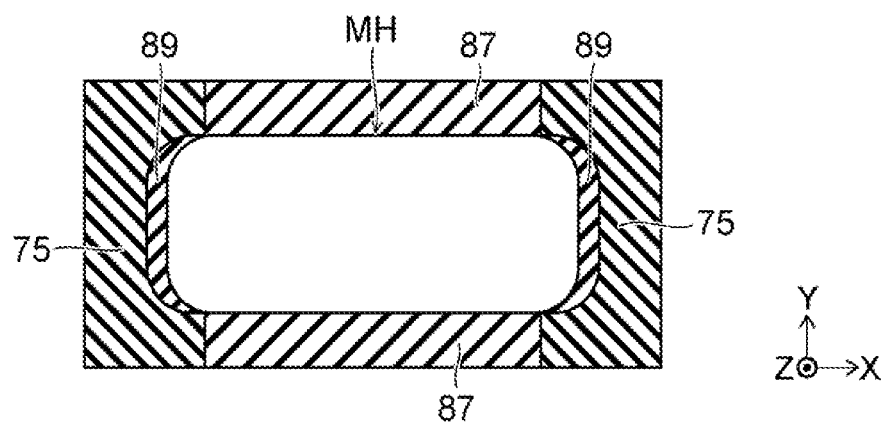
FIGS. 10A and 10B are schematic views illustrating the manufacturing process according to the embodiment.
Figure 10B:
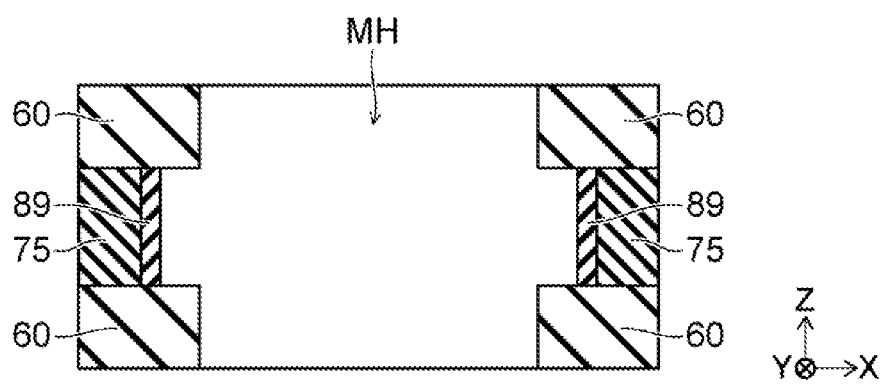

FIG. 10A is a schematic view illustrating a section including the memory hole MH and the sacrifice film 75 along the X-Y plane. FIG. 10B is a schematic view illustrating a section of the memory hole along the X-Z plane.

As illustrated in FIGS. 10A and 10B, a part of the sacrifice film 75 is selectively etched so that the memory hole MH is expanded in the X direction at each level of the stacked sacrifice film 75.

An insulating film 89 is formed by modifying the surface of the sacrifice film 75. The insulating film 89 is formed by performing, for example, a heat treatment in an atmosphere containing oxygen. The insulating film 89 contains, for example, silicon oxynitride (SiNO). The insulating material 87 containing PSZ is reformed into silicon oxide during this heat treatment.

Figure 11A:
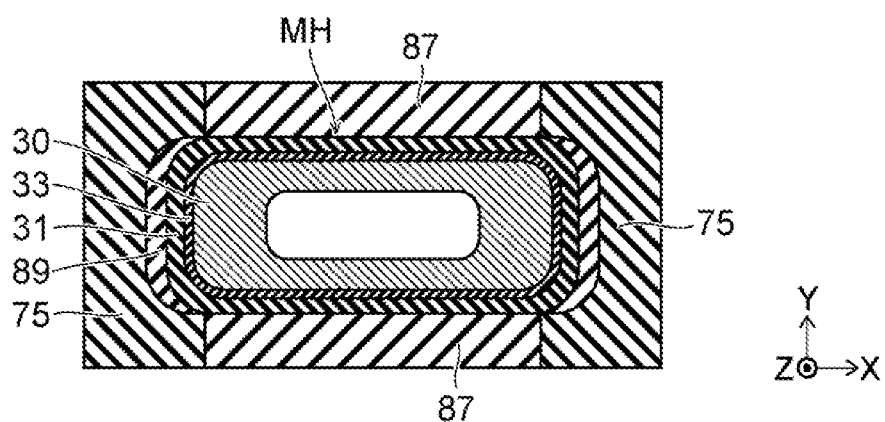
FIGS. 11A and 11B are schematic views illustrating the manufacturing process according to the embodiment.
Figure 11B:
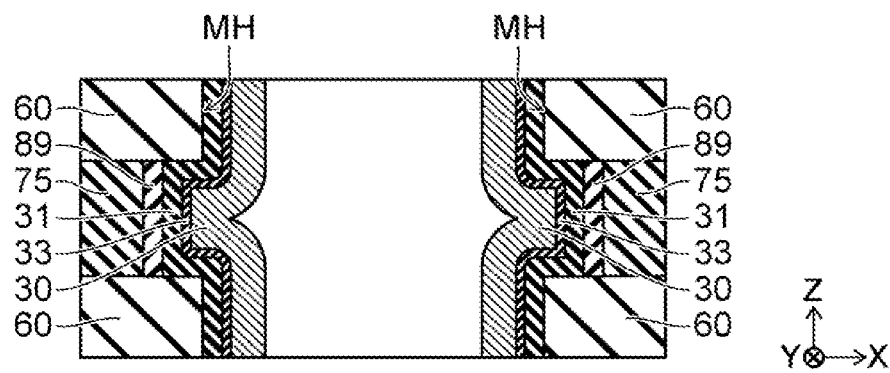

FIGS. 11A and 11B are schematic views illustrating the same sections as those of FIGS. 10A and 10B. As illustrated in FIGS. 11A and 11B, the insulating films 31 and 33 and the charge holding film 30 are formed within the memory hole MH.

The insulating film 31 is, for example, a silicon oxide film, and is formed to cover the inner surface of the memory hole MH. The insulating film 33 is, for example, a silicon nitride film, and is formed on the insulating film 31. The charge holding film 30 is formed on the insulating film 33. The charge holding film 30 contains, for example, a metal nitride such as titanium nitride (TiN). The charge holding film 30 may be a high dielectric film, a so-called High-K film or an HfSiO film that includes a metal compound having a high dielectric constant. Here, for example, the high dielectric film is, as an example, a film having a dielectric constant ($\varepsilon$) of about 13 or more, such as about 17 or more, about 20 or more, or about 25 or more. For the charge holding film 30, a material having a work function of about 4.4 electron volts (eV) or more may be used, such as a work function of about 5.0 eV or more, 6.0 eV or more, or 7.0 eV or more.

The charge holding film 30 is formed such that a part thereof is located between adjacent interlayer insulating films 60. The insulating films 31 and 33 and the charge holding film 30 are formed using, for example, CVD, such that a space is left within the memory hole MH.

Figure 12A:
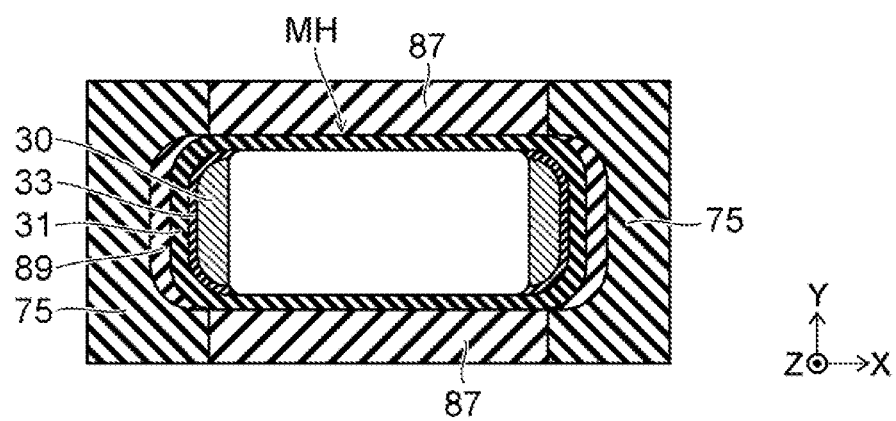
FIGS. 12A and 12B are schematic views illustrating the manufacturing process according to the embodiment.
Figure 12B:
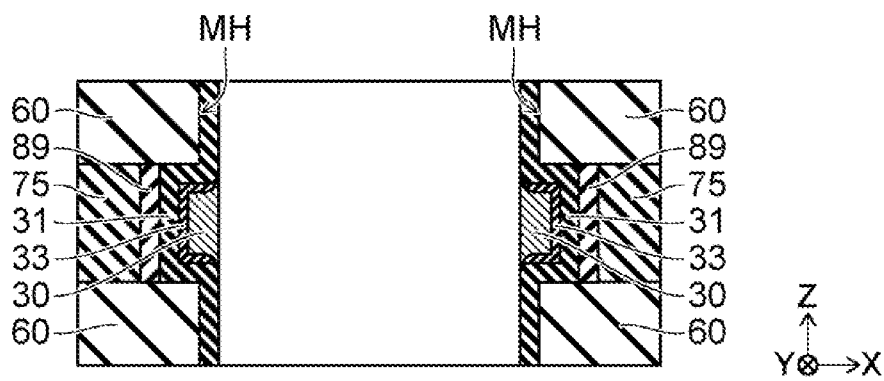

FIGS. 12A and 12B are schematic views illustrating the same sections as those of FIGS. 11A and 11B. As illustrated in FIGS. 12A and 12B, the charge holding film 30 and the insulating film 33 are removed while portions facing the sacrifice film 75 are left.

The charge holding film 30 and the insulating film 33 are removed using, for example, chemical dry etching (CDE) through a space within the memory hole MH. Thus, the charge holding films 30 are removed while a plurality of portions spaced apart from each other in the Z direction are left. Hereinafter, each of the plurality of portions facing the sacrifice films 75 is described as the charge holding film 30.

Figure 13A:
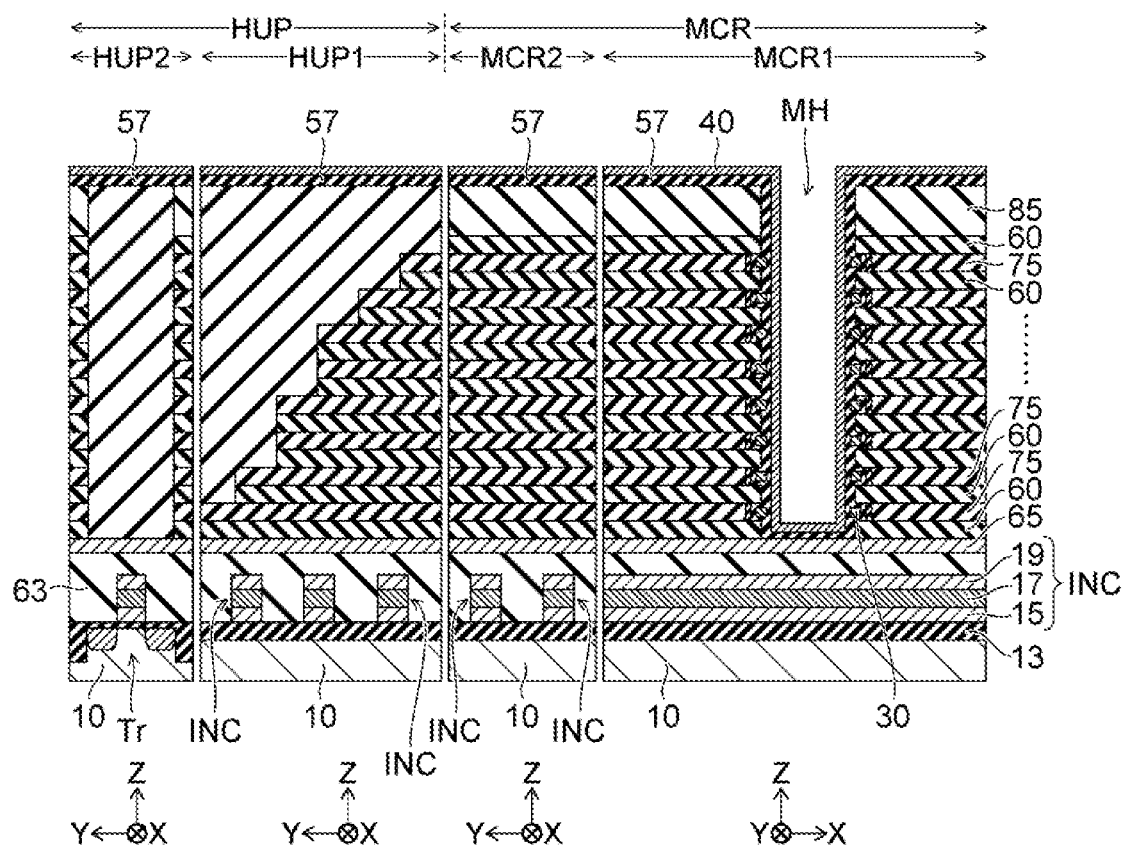
FIGS. 13A to 13C are schematic views illustrating the manufacturing process according to the embodiment.
Figure 13B:
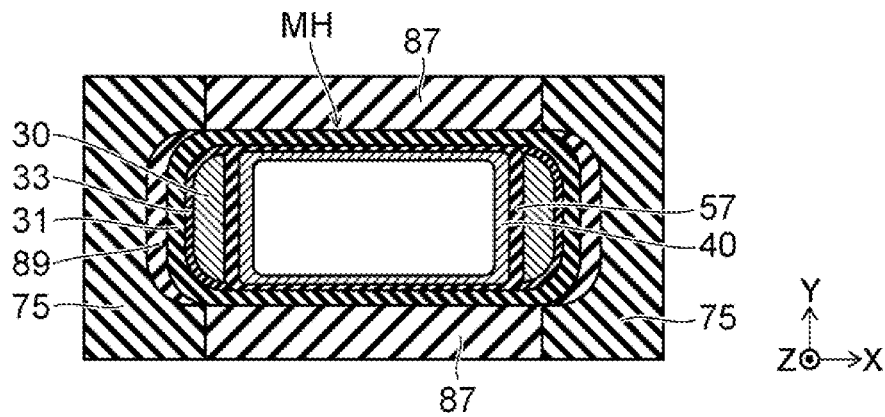
Figure 13C:
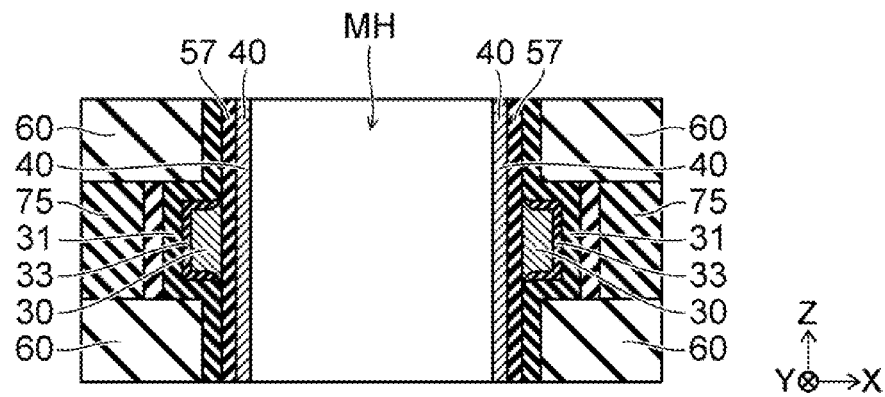

FIG. 13A is a schematic view illustrating the same section as that of FIG. 8. FIGS. 13B and 13C are schematic views illustrating sections corresponding to FIGS. 12A and 12B, respectively. As illustrated in FIGS. 13A to 13C, the insulating film 57 and the floating potential film 40 are formed to cover the inner surface of the memory hole MH.

The insulating film 57 is, for example, a silicon oxynitride film (SiON film), and is formed to cover the charge holding films 30. The floating potential film 40 is, for example, a polysilicon film doped with an impurity (e.g. a P-type impurity), and is formed on the insulating film 57. The floating potential film 40 is formed to have a film thickness of, for example, about 4 nm or less (e.g. about 3.8 nm or less, about 3.6 nm or less, or about 3.4 nm or less). Accordingly, the size of a memory cell MC in the X direction may be reduced. The insulating film 57 and the floating potential film 40 are formed such that a space is left within the memory hole MH.

Figure 14:
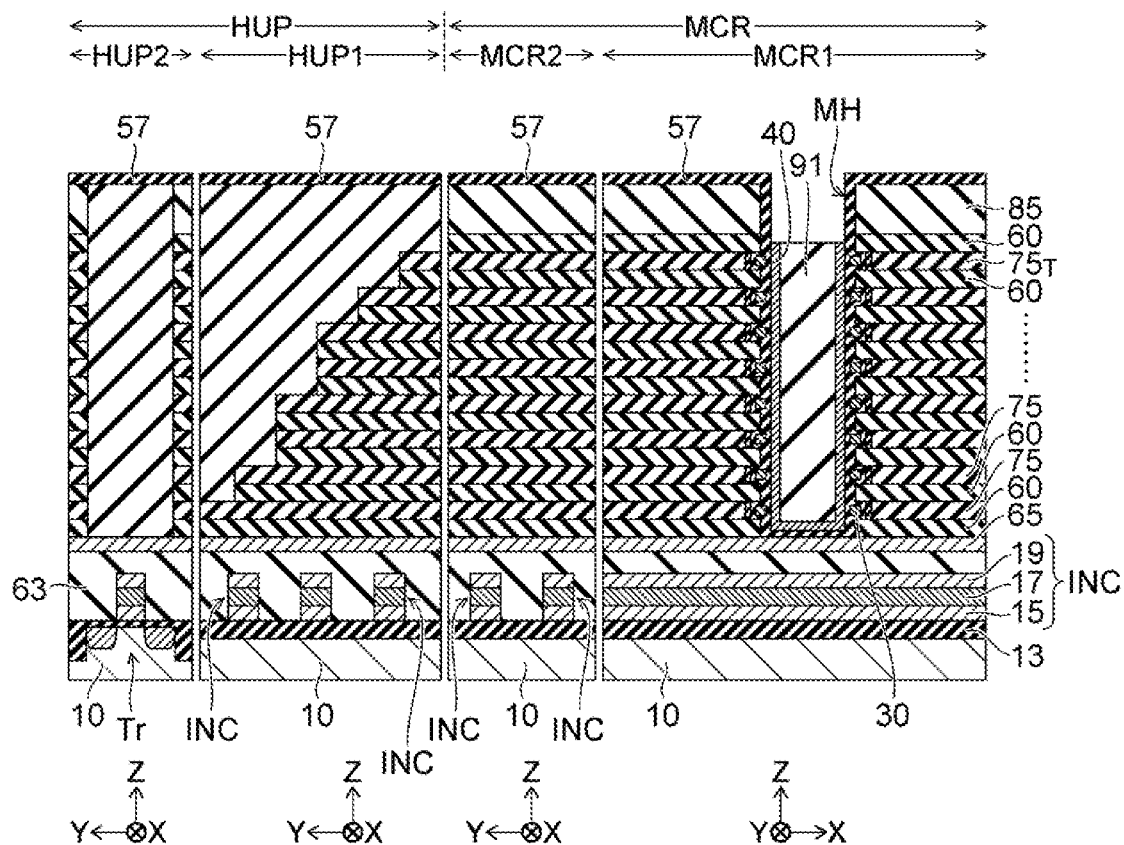
FIG. 14 is a schematic view illustrating the manufacturing process according to the embodiment.

FIG. 14 is a schematic view illustrating the same section as that of FIG. 13A. As illustrated in FIG. 14, the floating potential film 40 is selectively removed such that the upper end of the floating potential film 40 is located in the vicinity of a sacrifice film $75_T$ as the uppermost layer among the plurality of sacrifice films 75 and at a level higher than the sacrifice film $75_T$.

For example, after the floating potential film 40 is formed, an insulating film 91 is formed to substantially fill the memory hole MH. Subsequently, etch-back is performed such that the upper surface of the insulating film 91 is located in the vicinity of the sacrifice film $75_T$, and at a level higher than the sacrifice film $75_T$, and thus a part of the floating potential film 40 is exposed. Thereafter, the upper portion of the floating potential film 40 is removed using, for example, isotropic etching such that the upper end of the floating potential film 40 is located at the same level as the upper end of the insulating film 91.

Figure 15:
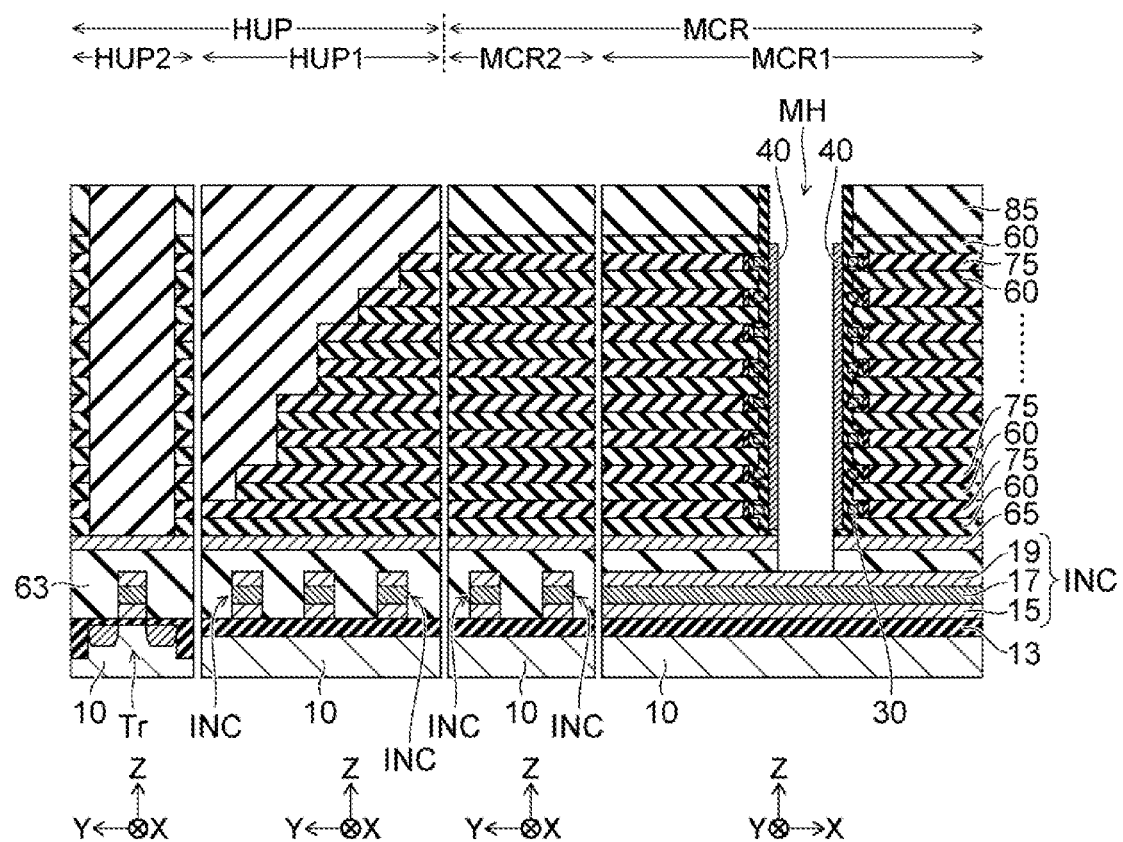
FIG. 15 is a schematic view illustrating the manufacturing process according to the embodiment.

FIG. 15 is a schematic view illustrating the same section as that of FIG. 14. As illustrated in FIG. 15, after the insulating film 91 is selectively removed, a part of the floating potential film 40 and a part of the insulating film 57 formed on the bottom surface of the memory hole MH are selectively removed. Each of the polysilicon film 65 and the interlayer insulating film 63 is selectively removed so that the wiring INC is exposed at the bottom surface of the memory hole MH. For such etching, for example, anisotropic RIE is used.

Figure 16A:
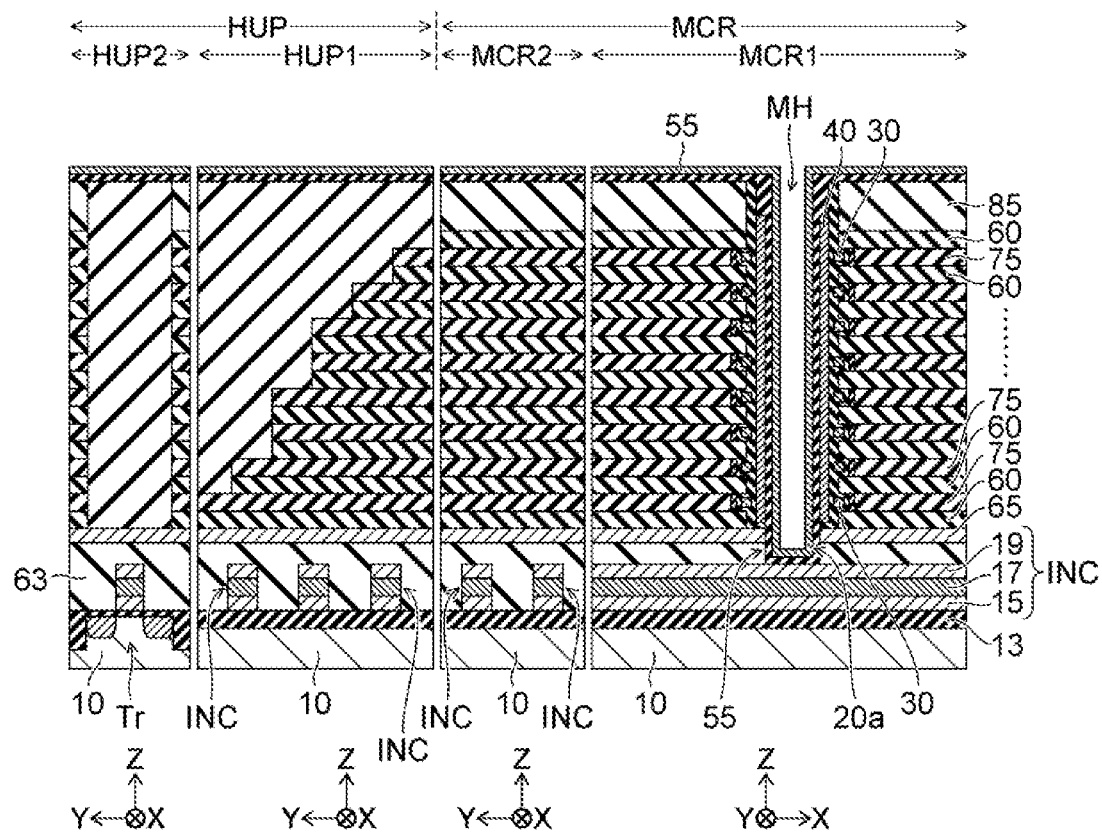
FIGS. 16A to 16C are schematic views illustrating the manufacturing process according to the embodiment.
Figure 16B:
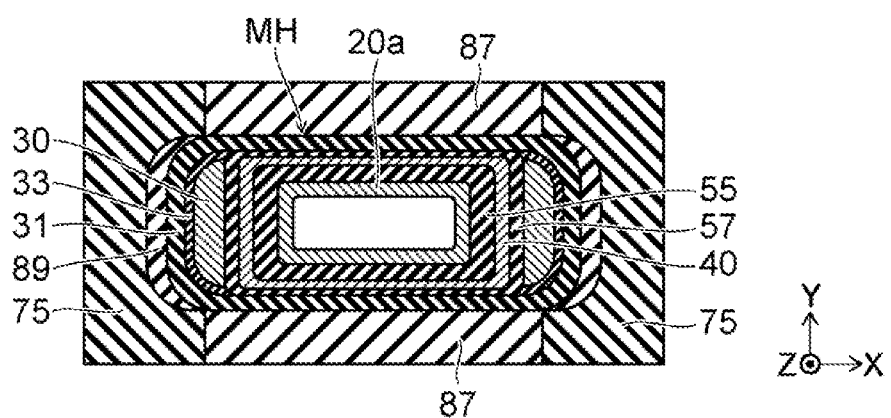
Figure 16C:
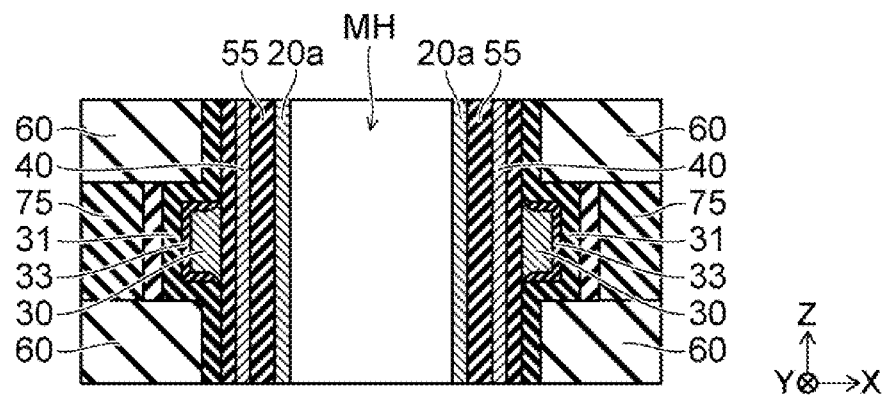

FIG. 16A is a schematic view illustrating the same section as that of FIG. 15. FIGS. 16B and 16C are schematic views illustrating the same sections as those of FIGS. 13B and 13C. As illustrated in FIGS. 16A to 16C, the insulating film 55 and the semiconductor film 20a are formed.

As illustrated in FIG. 16A, the insulating film 55 is formed to cover the inner surface of the memory hole MH using, for example, CVD. The insulating film 55 is, for example, a silicon oxide film. The semiconductor film 20a is formed on the insulating film 55 using, for example, CVD. The semiconductor film 20a is, for example, an amorphous silicon film. The insulating film 55 and the semiconductor film 20a are formed within the memory hole MH while a space is left.

Figure 17:
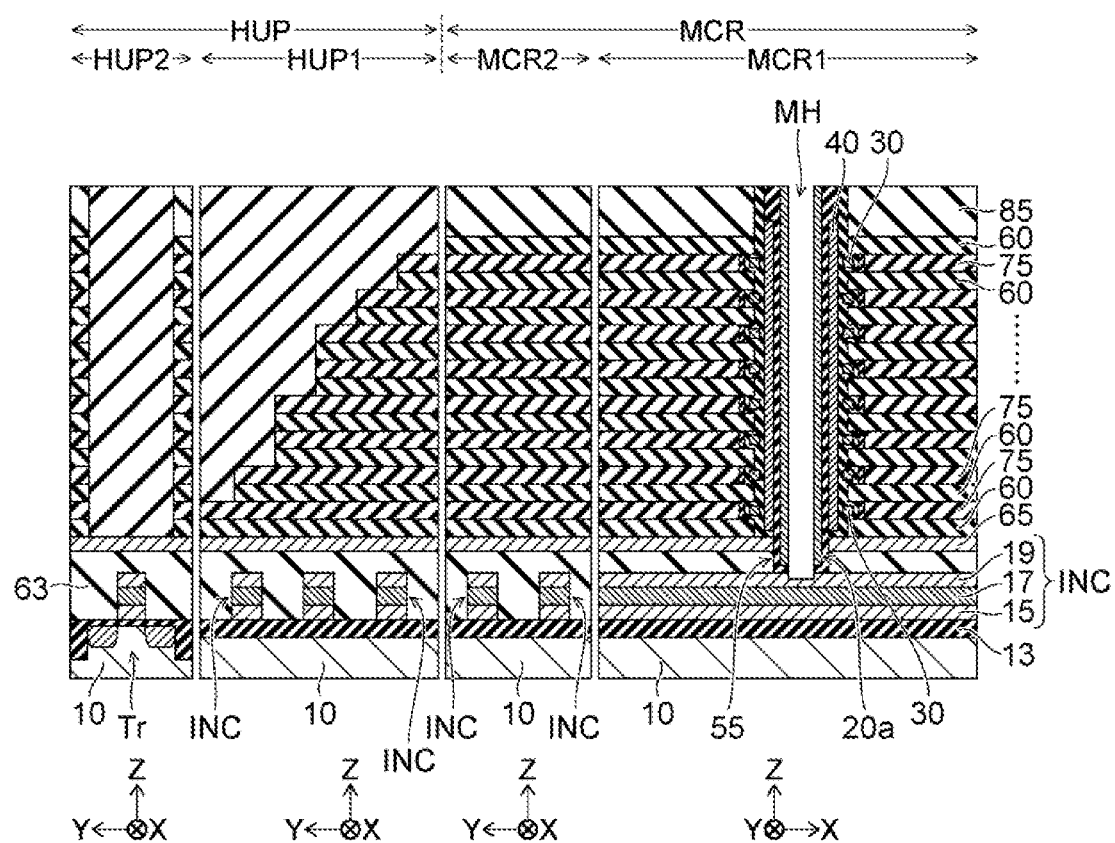
FIG. 17 is a schematic view illustrating the manufacturing process according to the embodiment.

FIG. 17 is a schematic view illustrating the same section as that of FIG. 16A. As illustrated in FIG. 17, a part of the insulating film 55 and a part of the semiconductor film 20a formed on the bottom surface of the memory hole MH are selectively removed. In this case as well, for example, by using anisotropic RIE, a part of the insulating film 55 and apart of the semiconductor film 20a may be selectively removed while portions formed on the inner wall of the memory hole MH are left.

Figure 18A:
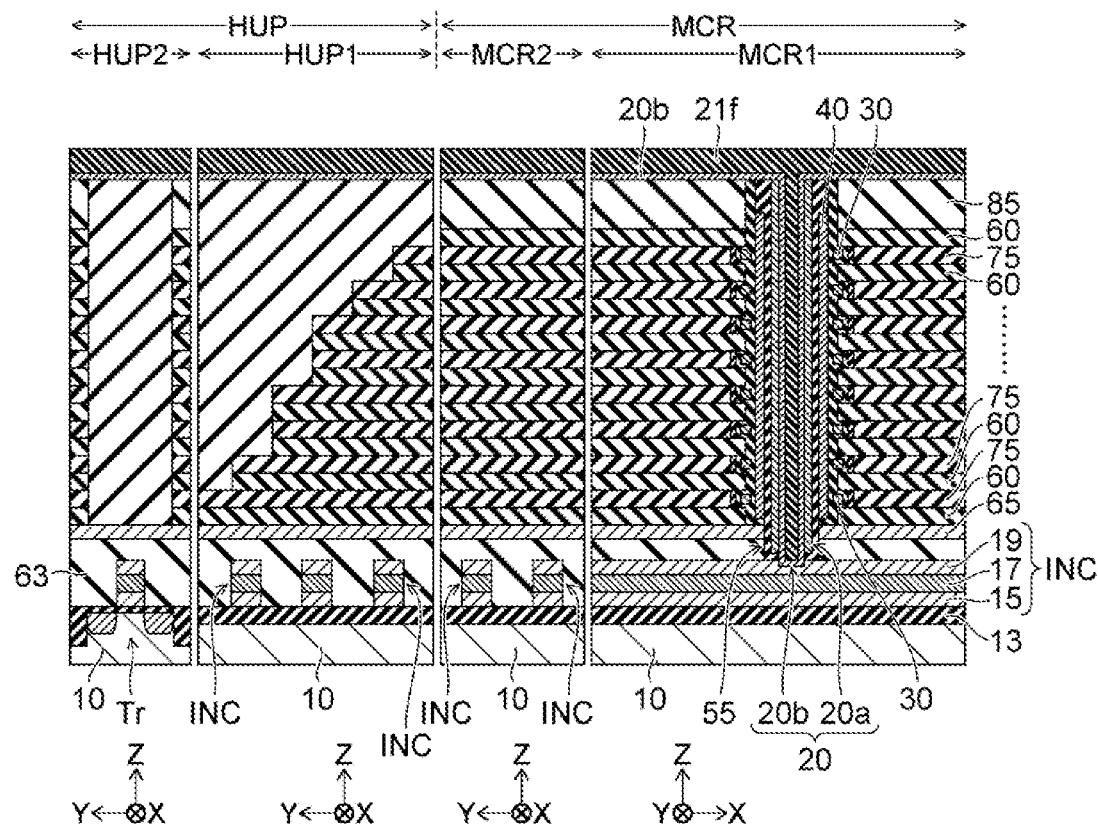
Figure 18B:
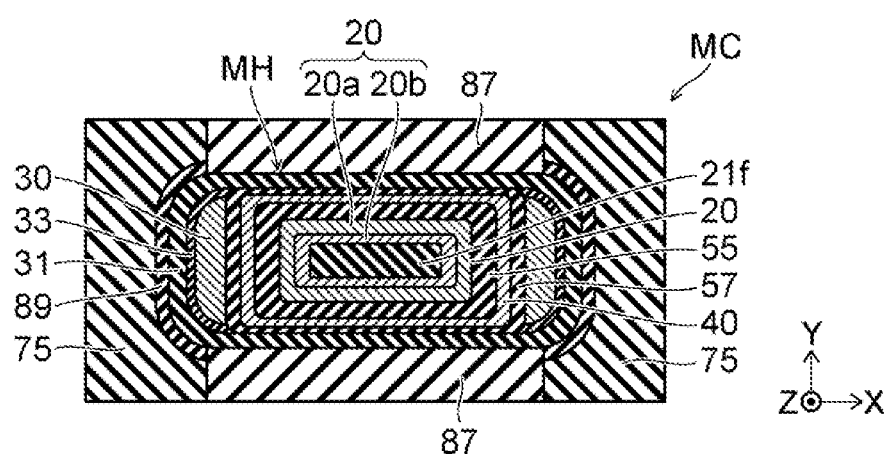

FIG. 18A is a schematic view illustrating the same section as that of FIG. 17. FIGS. 18B and 18C are schematic views illustrating the same sections as those of FIGS. 16B and 16C. As illustrated in FIGS. 18A to 18C, the semiconductor film 20b and an insulating material 21f are formed. The semiconductor film 20b is formed to cover the inner surface of the memory hole MH. The insulating material 21f is formed to substantially fill the inside of the memory hole MH.

The semiconductor film 20b is an amorphous silicon film formed using, for example, CVD. The insulating material 21f includes a silicon oxide formed by using, for example, CVD. The semiconductor film 20b is formed to be in contact with the wiring INC exposed at the bottom surface of the memory hole MH.

FIG. 19 is a schematic view illustrating the same section as that of FIG. 18A. As illustrated in FIG. 19, the insulating material 21f and the semiconductor film 20b are etched back so that portions formed on the upper surface of the insulating film 85 are removed. Here, the upper end of the semiconductor film 20a is also etched back. The insulating core 21 is formed within the memory hole MH.

Figure 20:
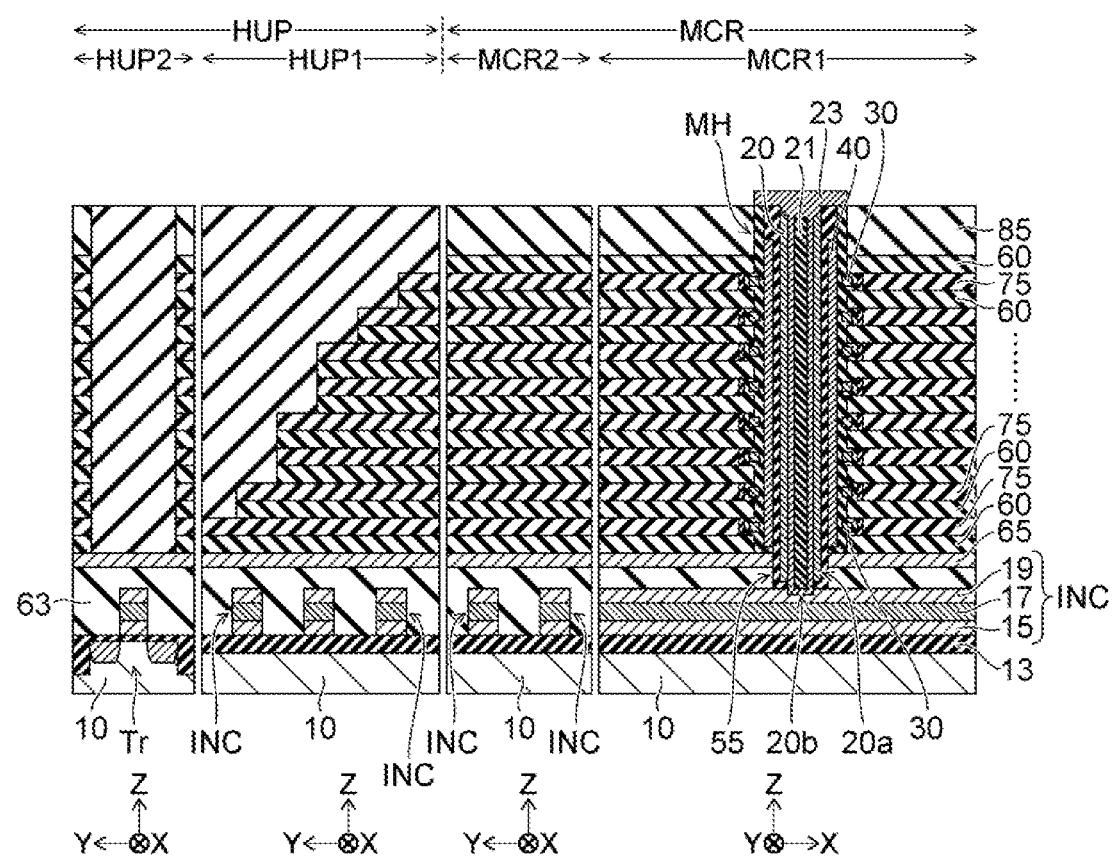
FIG. 20 is a schematic view illustrating the manufacturing process according to the embodiment.

FIG. 20 is a schematic view illustrating the same section as that of FIG. 19. As illustrated in FIG. 20, the cap film 23 is formed at the upper end of the memory hole MH. The cap film 23 is an amorphous silicon film formed using, for example, CVD. The cap film 23 is in contact with the upper ends of the semiconductor films 20a and 20b, and covers the upper end of the insulating core 21. Subsequently, a heat treatment is performed to convert amorphous silicon into polysilicon, and integrate the semiconductor films 20a and 20b and the cap film 23 with each other.

Figure 21:
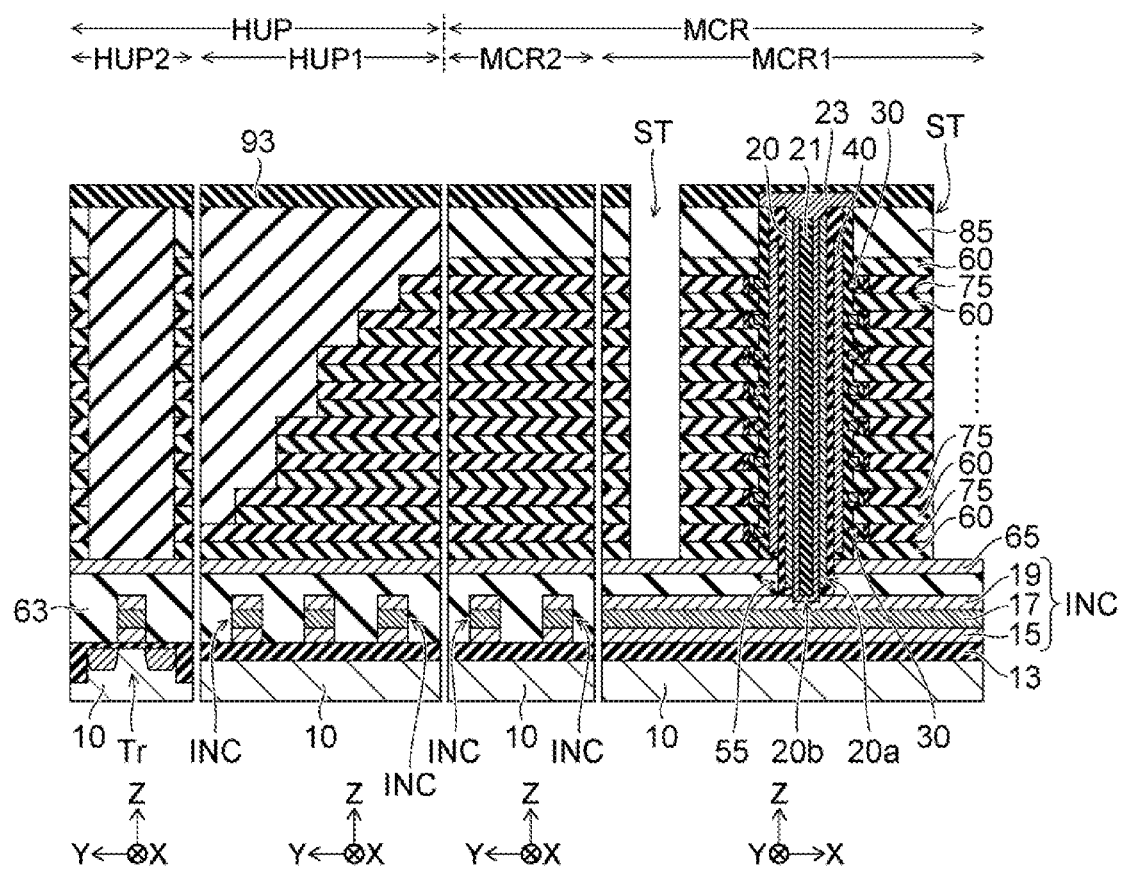
FIG. 21 is a schematic view illustrating the manufacturing process according to the embodiment.

FIG. 21 is a schematic view illustrating the same section as that of FIG. 20. As illustrated in FIG. 21, a slit ST is formed to divide the interlayer insulating films 60 and the sacrifice films 75. The slit ST is formed by selectively removing insulating films 93 and 85, the interlayer insulating films 60, and the sacrifice films 75 using, for example, anisotropic RIE. The slit ST has a depth from the upper surface of the insulating film 93 to the polysilicon film 65, and extends in the Y direction.

Figure 22:
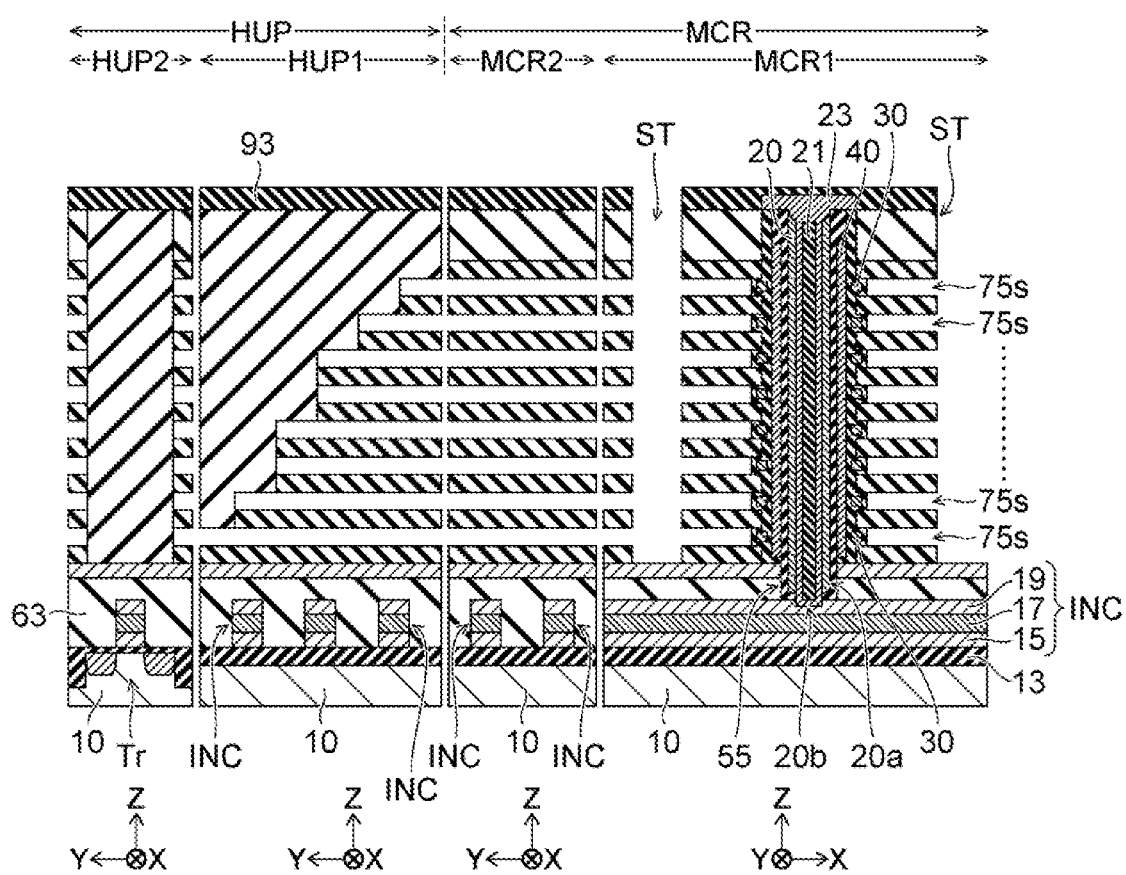
FIG. 22 is a schematic view illustrating the manufacturing process according to the embodiment.

FIG. 22 is a schematic view illustrating the same section as that of FIG. 21. As illustrated in FIG. 22, the sacrifice films 75 are selectively removed so that spaces 75S are formed between the interlayer insulating films 60. The sacrifice films 75 are selectively removed by supplying an etchant through, for example, the slit ST.

Figure 23:
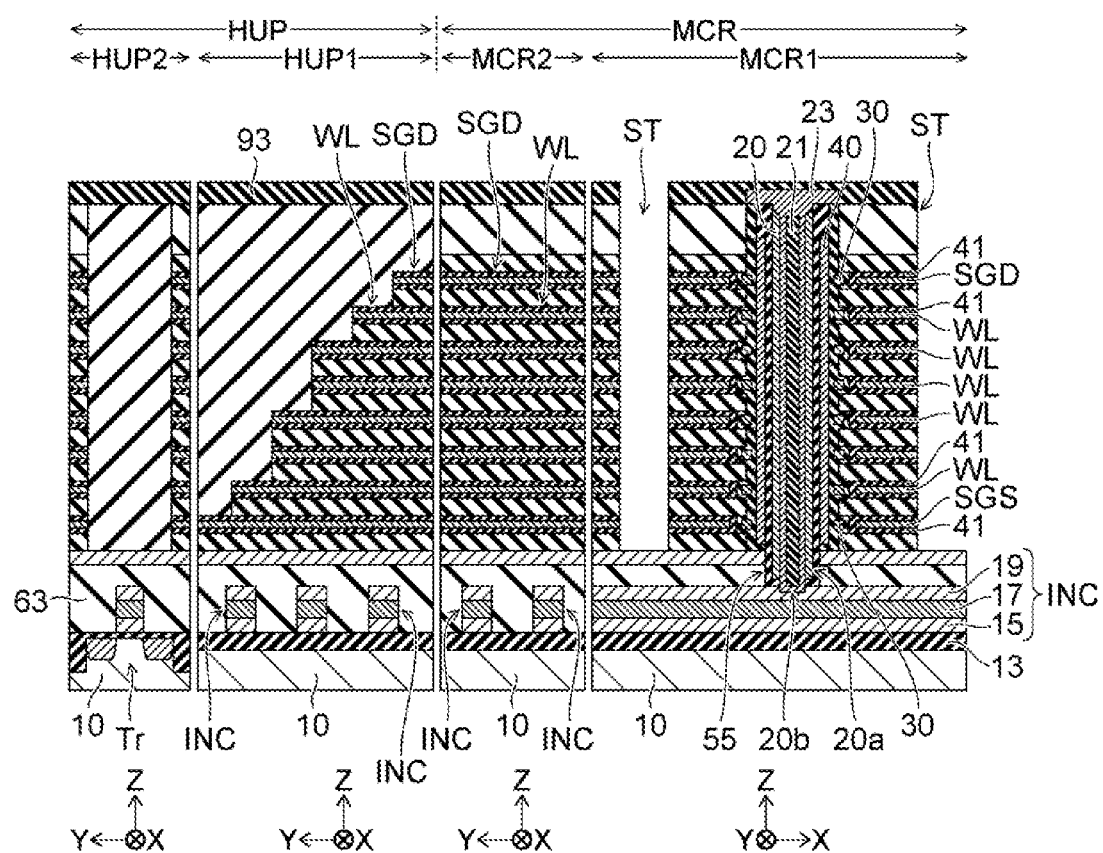
FIG. 23 is a schematic view illustrating the manufacturing process according to the embodiment.

FIG. 23 is a schematic view illustrating the same section as that of FIG. 22. As illustrated in FIG. 23, after the insulating film 41 is formed within the space 75S, a metal film is formed to fill up the space 75S. Accordingly, the select gate SGS, the word lines WL and the select gate SGD may be formed. The insulating film 41 is, for example, an aluminum oxide film, and the metal film is, for example, a tungsten film.

Figure 24:
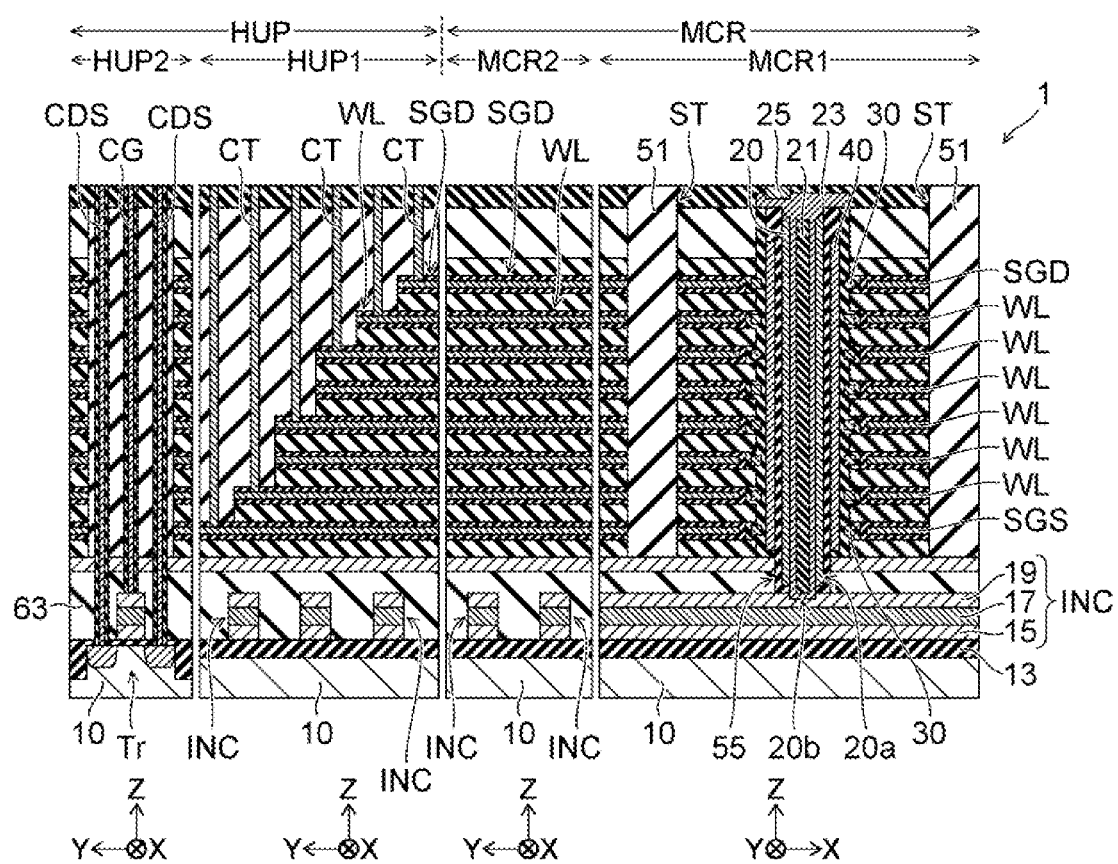
FIG. 24 is a schematic view illustrating the manufacturing process according to the embodiment.

FIG. 24 is a schematic view illustrating the same section as that of FIG. 23. As illustrated in FIG. 24, after an insulating film 51 disposed inside the slit ST is formed, the contact plugs CT, CDS, and CG and the connection plug 25 are formed.

In the lead-out region HUP, the contact plugs CT extend in the Z direction to connect to the select gate SGS, the word lines WL, and the select gate SGD, respectively. The contact plugs CDS and CG are connected to the source region, the drain region, and the gate electrode of the transistor Tr. In the memory cell region MCR, the connection plug 25 is formed to be connected to the cap film 23. Subsequently, an upper layer wiring is formed at the top side of the insulating film 93, thereby completing the storage device 1.

As used herein and not otherwise defined, the terms "substantially," "substantial," "approximately" and "about" are used to describe and account for small variations. When used in conjunction with an event or circumstance, the terms can encompass instances in which the event or circumstance occurs precisely as well as instances in which the event or circumstance occurs to a close approximation. For example, when used in conjunction with a numerical value, the terms can encompass a range of variation of less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to +0.05%.

While certain embodiments have been described, these embodiments have been presented by way of example only, and are not intended to limit the scope of the present disclosure. Indeed, the embodiments described herein may be embodied in a variety of other forms; furthermore, various omissions, substitutions and changes in the form of the embodiments described herein may be made without departing from the spirit of the present disclosure. The accompanying claims and their equivalents are intended to cover such forms or modifications as would fall within the scope and spirit of the present disclosure.

What is claimed is:

1. A storage device comprising:
   a plurality of first electrode films stacked in a first direction, and extending in a second direction intersecting the first direction;
   a plurality of second electrode films stacked in the first direction, extending in the second direction, and arranged adjacent to the plurality of the first electrode films in a third direction crossing the first and second directions;
   a first semiconductor film provided adjacent to the plurality of first electrode films, and extending in the first direction;
   a first charge holding film provided between one first electrode film among the plurality of first electrode films and the first semiconductor film, and comprising any one of a metal, a metal compound, and a high dielectric material;
   a second semiconductor film located between the first semiconductor film and the first charge holding film, extending in the first direction along the first semiconductor film, and electrically insulated from the plurality of first electrode films, the first charge holding film, and the first semiconductor film;
   a third semiconductor film provided adjacent to the plurality of second electrode films, and extending in the first direction;
   a second charge holding film provided between one second electrode film among the plurality of second electrode films and the third semiconductor film;
   a fourth semiconductor film located between the third semiconductor film and the second charge holding film, extending in the first direction along the third semiconductor film, and electrically insulated from the plurality of second electrode films, the second charge holding film, and the third semiconductor film;
   a first insulating film provided between the first semiconductor film and the third semiconductor film and extending in the first direction;
   a second insulating film provided between the plurality of first electrode films and the plurality of second electrode films, the second insulating film extending in the first direction; and a third insulating film provided between the plurality of first electrode films and the plurality of second electrode films, the third insulating film extending in the first direction, wherein the first insulating film provided between the second insulating film and the third insulating film in the second direction.

2. The storage device according to claim 1, further comprising: a plurality of insulating films provided between the plurality of first electrode films, wherein the plurality of insulating films include a fourth insulating film and a fifth insulating film provided such that one first electrode film among the plurality of first electrode films is interposed between the fourth insulating film and the fifth insulating film, and the first charge holding film is located between the fourth insulating film and the fifth insulating film.

3. The storage device according to claim 2, wherein the second semiconductor film is not disposed between the fourth insulating film and the fifth insulating film.

4. The storage device according to claim 2, wherein the second semiconductor film is disposed adjacent to at least one of the fourth insulating film and the fifth insulating film.

5. The storage device according to claim 4, wherein the second semiconductor film is disposed adjacent to both the fourth insulating film and the fifth insulating film.

6. The storage device according to claim 5, wherein the storage device comprises a plurality of memory cells, and the second semiconductor film defines, in part, each of the plurality of memory cells.

7. The storage device according to claim 1, wherein the second semiconductor film is adjacent to at least two of the plurality of first electrode films.

8. The storage device according to claim 1, wherein the first charge holding film comprises metal nitride.

9. The storage device according to claim 1, wherein the second semiconductor film is provided to surround the first semiconductor film.

10. The storage device according to claim 1, wherein the second semiconductor film comprises a P-type impurity.

11. The storage device according to claim 1, further comprising a substrate and a wiring layer disposed on the substrate, wherein the wiring layer connects to the first semiconductor film.

12. The storage device according to claim 1, further comprising a wiring layer including the third semiconductor film, a metal film, and the fourth semiconductor film.

13. The storage device according to claim 1, further comprising:

a sixth insulating film provided between the one first electrode film and the first charge holding film; and a seventh insulating film provided between the one second electrode film and the second charge holding film.

14. The storage device according to claim 1, further comprising a third charge holding film provided between the second semiconductor film and another one of the plurality of first electrode films, the another one of the plurality of first electrode films adjacent to the one first electrode film in the first direction.

15. The storage device according to claim 1, further comprising:

an insulating layer provided between the plurality of first electrode films and the plurality of second electrode films, and extending in the first direction; and a second insulating film provided between the one second electrode film and the second charge holding film.

* * * * *